(12) United States Patent
Hirose et al.

(10) Patent No.: US 9,279,982 B2
(45) Date of Patent: Mar. 8, 2016

(54) WEATHER-RESISTANT ARTICLE, WEATHER-RESISTANT FILM AND OPTICAL MEMBER

(75) Inventors: Tatsuya Hirose, Tokyo (JP); Soc Man Ho Kimura, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 680 days.

(21) Appl. No.: 13/059,912

(22) PCT Filed: Aug. 21, 2009

(86) PCT No.: PCT/JP2009/064628
§ 371 (c)(1),
(2), (4) Date: Feb. 18, 2011

(87) PCT Pub. No.: WO2010/024193
PCT Pub. Date: Mar. 4, 2010

(65) Prior Publication Data
US 2011/0165394 A1 Jul. 7, 2011

(30) Foreign Application Priority Data
Aug. 25, 2008 (JP) .................... 2008-215158

(51) Int. Cl.
*B32B 7/02* (2006.01)
*C23C 16/513* (2006.01)
(Continued)

(52) U.S. Cl.
CPC .......... *G02B 27/0006* (2013.01); *C08J 7/042* (2013.01); *C23C 16/402* (2013.01); *C23C 16/44* (2013.01); *C23C 28/40* (2013.01); *C23C 28/42* (2013.01);
(Continued)

(58) Field of Classification Search
CPC ...... C08J 7/042; G02B 5/283; G02B 27/0006; C23C 16/402; C23C 16/44; C23C 28/40; C23C 28/42; C23C 28/44; Y10T 428/24942; Y10T 428/24975
See application file for complete search history.

(56) References Cited

U.S. PATENT DOCUMENTS 5,332,618 A * 7/1994 Austin .................... 428/216
6,606,196 B2 * 8/2003 Mitsuishi et al. .......... 359/582
(Continued)

FOREIGN PATENT DOCUMENTS

JP 59-41249 3/1984
JP 2005-15557 1/2005
(Continued)

OTHER PUBLICATIONS

Japanese Office Action, Patent Application No. 2010-526677, date of drafting: Oct. 8, 2013 (3 pages).
(Continued)

*Primary Examiner* — Prashant J Khatri
(74) *Attorney, Agent, or Firm* — Lucas & Mercanti, LLP

(57) ABSTRACT

Provided is a support exhibiting excellent weather resistance, which is usable in an outdoor location for a long duration and is a support capable of sufficiently shielding UV radiation; and further provided are a weather-resistant article, a weather-resistant film, and an optical member which exhibit sufficient weather resistance even though receiving influences by heat, light or moisture. Disclosed is a weather-resistant article of the present invention possessing a support and provided thereon, a polymer layer containing a light stabilizer and a UV radiation reflective layer containing plural materials each having a different refractive index, the UV radiation reflective layer provided on the polymer layer.

19 Claims, 3 Drawing Sheets

(51) Int. Cl.
*G02B 27/00* (2006.01)
*C23C 16/40* (2006.01)
*C23C 28/00* (2006.01)
*C23C 16/44* (2006.01)
*C08J 7/04* (2006.01)
*G02B 5/28* (2006.01)

(52) U.S. Cl.
CPC ............... C23C 28/44 (2013.01); G02B 5/283 (2013.01); *C08J 2367/02* (2013.01); *Y10T 428/24942* (2015.01); *Y10T 428/24975* (2015.01)

(56) References Cited

U.S. PATENT DOCUMENTS 6,793,981 B2 * 9/2004 Nakajima ..................... 427/576
6,846,568 B2 * 1/2005 Yamaya et al. ............... 428/447
2003/0082412 A1 * 5/2003 Fukuda et al. ................ 428/697
2006/0264044 A1 * 11/2006 Kobayashi et al. ........... 438/680

FOREIGN PATENT DOCUMENTS

| JP | 2006-48039 | 2/2006 |
| JP | 2006-261287 | 9/2006 |
| JP | 2007-65232 | 3/2007 |
| JP | 2007-248883 | 9/2007 |
| JP | 2007-277631 | 10/2007 |

OTHER PUBLICATIONS

English translation of Japanese Office Action, Patent Application No. 2010-526677, date of drafting: Oct. 8, 2013 (4 pages).

* cited by examiner

FIG. 6

WEATHER-RESISTANT ARTICLE, WEATHER-RESISTANT FILM AND OPTICAL MEMBER

This is a 371 of PCT/JP2009/064628 filed Aug. 21, 2009 which in turn claimed the priority of Japanese Patent Application No. 2008-215158 filed Aug. 25, 2008, both applications are incorporated by reference herein.

TECHNICAL FIELD

The present invention relates to a weather-resistant article, a weather-resistant film and an optical member used mainly for a support desired to exhibit weather resistance, as an overlay film used for the purpose of surface protection, gloss enhancement and discoloration·deterioration prevention of films for marking, used by being attached onto the surface of railway vehicles, cars, automatic vending machines and so forth; a surface protective film of an exterior signboard; an antireflection sheet of a liquid crystal display, a backseat for a solar battery; a film for a film for electronic paper; an electromagnetic wave shielding film for a plasma display, a film for organic electroluminescence; a support of films to be attached onto a window such as a heat ray reflecting film so as to provide a heat ray reflecting effect by attaching facilities such as outside windows of building, car windows and so forth exposed to sunlight for a long time; a support for a reflective plate; a support for a light collecting plate; a support for films for a vinyl house used for agriculture; and so forth.

BACKGROUND

Usually, since UV radiation has higher energy than that of another light of sunlight, it has negative health effects on the human body and others. For this reason, UV radiation is desired to be shielded. When even UV-resistant glass is used for a long duration, discoloration is produced, and the content inside the glass is further deteriorated in discoloration caused by UV radiation. Specifically, polymeric resins exhibit large degradation caused by UV radiation.

Usually, a polymer film produces cleavage of molecular chains via photooxidation reaction upon exposure to UV radiation under the existence of oxygen, whereby degradation in strength, rise in haze, and lowering of transparency and color tone caused by yellowish change or the like (deterioration in UV radiation). UV radiation of sunlight has a wavelength of 295-400 nm, and light energy in this wavelength region is almost equal to the bonding energy of C, H or O. Therefore, when a plastic molding mainly having the bonding of C, H or O is exposed to UV radiation, such a bonding is broken, whereby degradation of resin, discoloration and lowering in mechanical strength tend to be produced. Accordingly, the plastic molding cannot be used stably in an outdoor location for a long duration. For this reason, generally well known is a technique by which a light stabilizer is blended in a polymer film to improve weather resistance of the resulting polymer film.

The light stabilizer is a stabilizer used for the purpose of inhibiting photooxidation reaction of the polymer film caused by UV radiation, and as the light stabilizer, a UV absorbent, quencher, and HALS (Hindered Amine Light Stabilizer) are well known.

The UV absorbent is a light stabilizer which absorbs UV radiation, and discharges energy absorbed in the molecule by making the energy to be lower energy in the form of heat, phosphorescence, or fluorescence, and as the UV absorbent, a benzophenone type, a benzotriazol type, a benzoate type, a cyanoacrylate type and so forth are practically available.

The quencher is a light stabilizer by which one in which a chromophoric group (mainly an unsaturated hydrocarbon and its compound) being on a ground state absorbs UV radiation so as to become an excited state is returned into the original ground state, and as the quencher, Ni compounds are employed.

The HALS is a light stabilizer which traps an alkyl radical, a peroxy radical and so forth produced via exposure to UV radiation to inhibit photooxidation reaction, and the HALS is a compound having a hindered piperidine moiety.

However, even though a light stabilizer such as a UV absorbent or the like is contained in a polymer film, influence of UV radiation can not be sufficiently removed from the surface, whereby deterioration on the surface of the polymeric resin can not be suppressed. Further, in order to obtain sufficient weather resistance, a sufficient amount of a light stabilizer is desired to be contained, but the polymeric resin is exposed to an environment of heat and water, bleed-out, sublimation and so forth are generated, whereby the light stabilizer is reduced, resulting in lowering in weather resistance, lowering in transparency and rise in haze, leading to insufficient aging stability. Further, since a light stabilizer is expensive, a large cost-up results.

As another method of enhancing weather resistance, there is a method of coating a layer containing a UV absorbing material composed of an organic substance or inorganic particles (refer to Patent Documents 1 and 2). This is an effective means, but in the case of outdoor use, the surface of the coating film is exposed to rain water, oxygen in the air, or pollution substances, and exposed to UV radiation since there is no sufficient UV absorbent on the surface. Therefore, deterioration caused by UV radiation is generated, and there appears a large problem such as obstacles such as coloring such as yellowish color, lowering in transmittance and rise in haze.

Further, in the case of at least one of a UV absorbent and a hindered amine based light stabilizer, disappearance of bleed-out produced by the UV absorbent or the like is seen, resulting in insufficient weather resistance. Further, a large amount of UV absorbent is to be provided in order to obtain sufficient UV absorbability. However, when increasing a UV absorbent amount, absorbing occurs in not only a UV wavelength range, but also even a short wavelength range of visible light, resulting in lowering in transmittance from the initial to visible light region.

In cases where inorganic particles are used as a light stabilizer (Patent Document 1), they are more stable than an organic light stabilizer with respect to UV radiation, heat and so forth. However, similarly to an organic UV absorbent, influence of UV radiation to the surface can not be sufficiently eliminated, and deterioration caused by UV radiation, on the surface of a resin layer containing inorganic particles, can not be inhibited. Therefore, lowering in rise in haze, yellowish change, and visible light transmittance results. Further, inorganic UV absorbents should have an average particle diameter of 100 nm or less in order to maintain transparency and a clear property in the visible light region. When the particle diameter is small, the particles exhibit high surface energy, and coagulation of particle-to-particle is easy to be generated, whereby an aggregate thereof produces scattering of light in the visible light region, and the resulting coated film tends to lose a clear property. Further, in order to obtain sufficient UV shielding performance for protection of a resin support, coagulation of particles is further produced, since a necessary amount of inorganic UV shielding agent is larger than that of an organic UV absorbent. Further, inorganic particles tend to absorb UV radiation to activate surrounding water, oxygen and so forth (photocatalytic function). Therefore, in the case of outdoor use, water such as rain water or the like is activated with UV radiation and inorganic particles, whereby the active species decompose organic components of the coating film and the resin support, resulting in generation of a peeled coating film, rise in haze, yellowish change and so forth.

As another method of improving weather resistance, there is a method of providing a UV radiation reflective layer by a dielectric laminate in which a low refractive index layer and a high refractive index layer are alternately laminated (for example, Patent Documents 3 and 4). In the case of this method, since the dielectric is made of an inorganic substance, a UV shielding film composed of a dielectric laminate is difficult to be deteriorated even though it is exposed to UV radiation, an atmospheric pollutant, rain water or the like, leading to largely effective shielding of UV radiation for a long duration. However, in order to shield 90% or more of UV radiation, a certain amount of film thickness should be provided, resulting in high cost. Further, since at least several percent of UV radiation is transmitted, the resin support is degraded because of this several percent of UV radiation in the case of outdoor use for a long duration (at least a few years).

PRIOR ART DOCUMENT

Patent Document

Patent Document 1: Japanese Patent Open to Public Inspection (O.P.I.) Publication No. 2006-48039
Patent Document 2: Japanese Patent O.P.I. Publication No. 2005-15557
Patent Document 3: Japanese Patent O.P.I. Publication No. 2007-248883
Patent Document 4: Japanese Patent O.P.I. Publication No. 2007-65232

DISCLOSURE OF THE INVENTION

Problems to be Solved by the Invention

The present invention has been made on the basis of the above-described problems, and it is an object of the present invention to provide a support exhibiting excellent weather resistance, which is usable in an outdoor location for a long duration; to provide a support capable of sufficiently shielding UV radiation; and further to provide a weather-resistant article, a weather-resistant film, and an optical member which exhibit sufficient weather resistance even though receiving influences by heat, light or moisture.

Means to Solve the Problems

The above-described problems in the present invention are accomplished by the following structures.

(Structure 1) A weather-resistant article comprising a support and provided thereon, a polymer layer comprising a light stabilizer and a UV radiation reflective layer comprising plural materials each having a different refractive index, the UV radiation reflective layer provided on the polymer layer.

(Structure 2) The weather-resistant article of Structure 1, wherein the support comprises a transparent support.

(Structure 3) The weather-resistant article of Structure 2, wherein the transparent support is made of a resin.

(Structure 4) The weather-resistant article of Structure 1, wherein the light stabilizer comprises a UV absorbent.

(Structure 5) The weather-resistant article of any one of Structures 1-4, wherein the UV radiation reflective layer comprises plural layers each having a different refractive index.

(Structure 6) The weather-resistant article of any one of Structures 1-5, wherein the UV radiation reflective layer has a structure in which a low refractive index layer having a refractive index of 1.4-1.8 and a thickness of 5-1000 nm and a high refractive index layer having a refractive index of 1.8-2.4 and a thickness of 5-400 nm are alternatingly laminated to provide at least three layers.

(Structure 7) The weather-resistant article of Structure 6, wherein the UV radiation reflective layer comprises a low refractive index layer containing oxide or nitrogen oxide containing Si or Al, and a high refractive index layer containing oxide, nitrogen oxide or nitride containing Zn, Ti, Sri, In, Nb, Si, Ta or Al.

(Structure 8) The weather-resistant article of any one of Structures 1-7, comprising the UV radiation reflective layer formed by supplying a gas containing a thin film forming gas and a discharge gas into a discharge space under the atmospheric pressure or a pressure close to the atmospheric pressure to excite the gas via application of a high-frequency electric field to the discharge space, and exposing the support to the excited gas.

(Structure 9) The weather-resistant article of Structure 8, wherein the discharge gas is nitrogen gas; the high-frequency electric field applied to the discharge space is a high-frequency electric field obtained by superimposing a first high frequency-electric field and a second high-frequency electric field, where frequency $\omega 2$ of the second high-frequency electric field is higher than frequency $\omega 1$ of the first high-frequency electric field; a relationship among first high-frequency electric field intensity V1, second high-frequency electric field intensity V2, and discharge starting electric field intensity IV satisfies Va≥IV>V2 or V1>IV≥V2; and the second high-frequency electric field has an output power density of 1 W/cm$^2$ or more.

(Structure 10) The weather-resistant article of any one of Structures 1-9, wherein the polymer layer comprises a photocurable or thermosetting resin as a main component.

(Structure 11) The weather-resistant article of any one of Structures 1-10, wherein the support is a support made of a resin comprising polyethylene terephthalate, polybutylene terephthalate or polyethylene naphthalate.

(Structure 12) The weather-resistant article of any one of Structures 1-11, comprising the support made of a resin and provided on at least one surface of the support, the polymer layer comprising the light stabilizer, the UV radiation reflective layer comprising the plural materials each having a different refractive index and a water vapor bather layer, the UV radiation reflective layer and the water vapor bather layer provided on the polymer layer.

(Structure 13) The weather-resistant article of any one of Structures 1-12, wherein the water vapor barrier layer comprises a metal oxide layer containing oxide, nitrogen oxide or nitride containing Si or Al.

(Structure 14) The weather-resistant article of Structure 12 or 13, comprising the water vapor barrier layer formed via a thin film forming method to prepare a thin film on the support made of a resin by supplying a gas containing a thin film forming gas and a discharge gas into a discharge space under the atmospheric pressure or a pressure close to the atmospheric pressure to excite the gas via application of a high-frequency electric field to the discharge space, and exposing the support made of a resin to the excited gas.

(Structure 15) The weather-resistant article of Structure 14, wherein the discharge gas is nitrogen gas; the high-frequency electric field applied to the discharge space is a high-frequency electric field obtained by superimposing a first high frequency-electric field and a second high-frequency electric field, where frequency $\omega 2$ of the second high-frequency electric field is higher than frequency $\omega 1$ of the first high-frequency electric field; a relationship among first high-frequency electric field intensity V1, second high-frequency electric field intensity V2, and discharge starting electric field intensity IV satisfies V1≥IV>V2 or V1>IV≥V2; and the second high-frequency electric field has an output power density of 1 W/cm² or more.

(Structure 16) The weather-resistant article of any one of Structures 12-15, wherein the water vapor barrier layer comprises at least one silicon oxide film having a carbon content of less than 0.1 at % and at least one silicon oxide film having a carbon content of 1-40 at %.

(Structure 17) The weather-resistant article of any one of Structures 1-16, exhibiting a visible light transmittance of 75% or more.

(Structure 18) The weather-resistant article of any one of Structures 1-17, exhibiting a haze of 1.5% or less.

(Structure 19) The weather-resistant article of any one of Structures 12-18, comprising the UV radiation reflective layer composed of low refractive index layers, at least one of the low refractive index layers being the water vapor barrier layer.

(Structure 20) A weather-resistant film comprising the weather-resistant article of any one of Structures 1-19.

(Structure 21) An optical member comprising the weather-resistant article of any one of Structures 1-19.

Effect of the Invention

In the present invention, provided can be a weather-resistant article, a weather-resistant film, and an optical member which are capable of using in the outdoor location for a long duration and of sufficiently shielding UV radiation, and exhibit sufficient weather resistance even though receiving influences by heat, light or moisture.

BRIEF DESCRIPTION OF THE DRAWINGS

FIG. 6 is a diagram showing a cross-sectional structure of each weather-resistant article sample prepared in Example.

DESCRIPTION OF THE PREFERRED EMBODIMENTS

Figure 1:
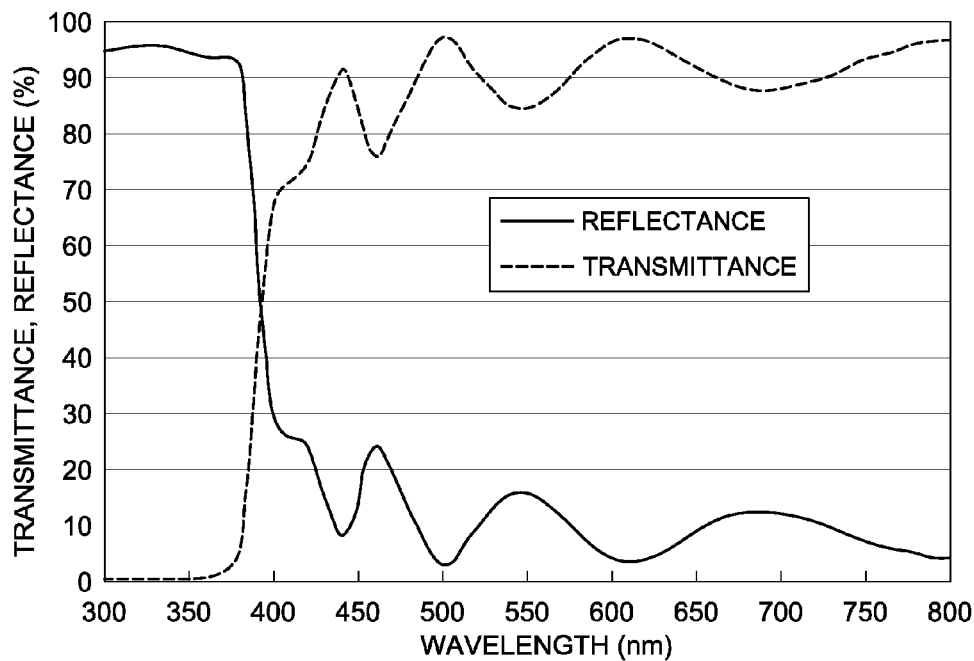
FIG. 1 is a diagram showing characteristics of reflectance and transmittance of a UV radiation reflective layer in which the high refractive index layer and the low refractive index layer each are laminated in order.

After considerable during intensive studies on the basis of the above-described problems, the inventors have found out that a resin support and an optical member shielding UV radiation together with maintaining of other matter properties even though being used in the outdoor location, and exhibiting sufficient weather resistance even though being affected by heat, light or moisture are obtained by a material in which a UV radiation reflective layer to reflect UV radiation via optical designing, composed of a dielectric made of metal oxide as a main component is provided on a polymer layer containing a light stabilizer, the polymer layer provided on a support, leading to accomplishment of the present invention. Specifically, the effect is largely enhanced for a support made of a polymeric resin among various supports, and the support is preferably usable.

In the present invention, it would appear that most of UV radiation is shielded by a UV radiation layer to reflect UV radiation via optical designing with a dielectric made of metal oxide as a main component, and UV radiation which is beyond shielding with a UV radiation reflective layer to reflect UV radiation via optical designing with a dielectric made of metal oxide as a main component is further shielded by a polymer layer containing a light stabilizer so as not to bring UV radiation to the support, whereby a support exhibiting degradation of the support caused by UV radiation can be obtained. Further, it would appear that degradation of a polymer layer per se caused by UV radiation via presence of a UV radiation reflective layer provided on the polymer layer is inhibited, and disappearance of a light stabilizer caused by light exposure to UV radiation is also inhibited. For this reason, a support exhibiting no degradation caused by UV radiation can be obtained even though being used in the outdoor location, since a light stabilizer in the polymer layer is stably present for a long duration. Furthermore, it would appear that not only the UV radiation reflective layer suppresses bleed-out of a light stabilizer in the polymer layer, but also the effect of shielding UV radiation, produced in the polymer layer continues to obtain a resin support exhibiting no degradation caused by UV radiation even though being used in the outdoor location for a long duration.

Next, the present invention will be described in detail.

<<Support>>

In the present invention, the support may be any of glass, a resin support and so forth, as long as it is one which can support the above-described polymer layer or UV radiation reflective layer. The weather-resistance article of the present invention is one in which a polymer layer containing the after-mentioned light stabilizer, and a UV radiation reflective layer are provided on at least one surface of a support.

<<Resin Support>>

In the present invention, a resin support means a resin film singly, or a resin film obtained by laminating organic layers such as polymer layers each containing a light stabilizer on at least one of both surfaces of the resin film.

The support used in the present invention is not specifically limited, as long as it is a resin film capable of supporting the above-described polymer layer or UV radiation reflective layer.

Specifically, usable examples of the resin constituting a resin support include polyolefin (PO) resins such as homopolymers or copolymers of ethylene, polypropylene, butane or the like; amorphous polyolefin resins (APO) such as cyclic polyolefin; polyester based resins such as polyethylene terephthalate (PET) and polyethylene-2,6-naphthalate (PEN); polyamide (PA) based resins such as nylon 6, nylon 12 and copolymerized nylon; polyvinyl alcohol based resins such as polyvinyl alcohol (PVA) resins, ethylene-vinyl alcohol copolymer (EVOH); polyimide (PT) resins; polyetherimide (PEI) resins; polysulfone (PS) resins; polyether sulfone (PES) resins; polyether ether ketone (PEEK) resins; polycarbonate (PC) resins; polyvinyl butyrate (PVB) resins; polyarylate (PAR) resins; fluorine based resins such as ethylene-tetrafluoride ethylenic copolymer (ETFE), ethylene chloride trifluoride (PFA), ethylene tetrafluoride-perfluoroalkyl vinyl ether copolymer (FEP), vinylidene fluoride (PVDF), vinyl fluoride (PVF), perfluoroethylene-perfluoropropylene-perfluorovinyl ether copolymer (EPA); and so forth.

Further, in addition to the above-described resins, usable examples include photo-curable resins such as a resin composition composed of an acrylate compound having a radical reactive unsaturated compound; a resin composition composed of the above-described acrylate compound and a mercapto compound having a thiol group; and a resin composition in which an oligomer such as epoxy acrylate, urethane acrylate, polyester acrylate, polyether acrylate or the like is dissolved in a polyfunctional acrylate monomer; and a mixture thereof. Further, those in which at least one of the above-described resins is laminated by means of laminating, coating or the like are also usable as a resin film.

These materials may be used singly or may be mixed appropriately. Among them, preferably usable are ZEONEX and ZEONOR (produced by Zeon Corporation), ARTON as an amorphous cyclopolyolefin resin film (produced by JSR Corporation), PURE ACE as a polycarbonate film (produced by TEIJIN LIMITED), and KONICA TAC KC4UX, KC8UX as a cellulose triacetate film (produced by Konica Minolta Opt. Inc.).

Further, it is desirable that a resin film exhibits transparency, light resistance and high weather resistance.

Furthermore, the above-described resin film may be an unstretched film or a stretched film.

The resin film of the present invention can be prepared by a commonly known conventional method. For example, a resin used as a material is melted with an extruder, and the resin is extruded from a ring die or a T die and rapidly cooled to prepare an unstretched support which is substantially amorphous and unstretched. Further, such an unstretched support is stretched in the flow direction of the support (vertical direction) or in the direction perpendicular to the flow direction (lateral direction) by a commonly known method such as uniaxial stretching, tentar type serial biaxial stretching, tentar type simultaneous biaxial stretching or tubular type simultaneous biaxial stretching to prepare a stretched support. In this case, a stretching magnification may be appropriately selected in accordance with the resin used as a material, but the magnification may be preferably 2-10 times in the vertical direction as well as in the lateral direction.

Among resins constituting the support film, preferable examples include aromatic polyesters typified by polyethylene terephthalate and polyethylene-2,6-naphthalate; aliphatic polyamide typified by nylon 6 and nylon 66; polyolefin typified by aromatic polyamide, polyethylene and polypropylene; polycarbonate and so forth. Of these, more preferable are aromatic polyester, polyethylene terephthalate and poly-ethylene-2,6-naphthalate; and specifically preferable are polyethylene terephthalate, polybutylene terephthalate and polyethylene naphthalate.

The foregoing aromatic polyester may contain suitable filler, if desired. As this filler, those as the lubrication providing agent for a polyester film are provided, and examples thereof include calcium carbonate, calcium oxide, aluminum oxide, kaolin, silicon oxide, zinc oxide, carbon black, silicon carbide, tin oxide, cross-linked acrylic resin particles, cross-linked poly styrene resin particles, melamine resin particles, cross-linked silicon resin particle and so forth. The lubrication providing agent has an average particle diameter of 0.01-10 μm, and the content of the agent is 0.0001-5% by weight, falling within an amount maintaining transparency of the film. Further, the aromatic polyester may appropriately contain a colorant, an antistatic agent, an antioxidant, an organic lubricant, catalyst residue particles and so forth.

Further, the resin support of the present invention may be subjected to a surface treatment such as a corona treatment, a flame treatment, a plasma treatment, a glow discharge treatment, a surface roughening treatment, a chemical treatment and so forth before forming a polymer layer, a UV radiation reflective layer, water vapor barrier layer and so forth.

It is convenient that the resin support is utilized as a long size product wound up in the form of a roll. The resin support is preferably set to have a thickness of 10-400 μm, and is more preferably set to have a thickness of 30-200 μm in view of suitability as a weather-resistant resin support, though there is no specific limitation.

<<Polymer Layer>>

It is a feature in the present invention that a polymer layer containing a light stabilizer is provided between a support and the foregoing UV radiation reflective layer.

In the present invention, the polymer layer is preferably made of a photo-curable or thermosetting resin as a main component.

(Polyfunctional Acrylate)

The polymer film (layer) made of a photo-curable resin or thermosetting resin as a main component contains an actinic ray curable resin such as UV radiation, and a polyfunctional acrylate is preferable. The polyfunctional acrylate is preferably selected from the group consisting of pentaerythritol polyfunctional acrylate, dipenta erythritol polyfunctional acrylate, pentaerythritol polyfunctional methacrylate and dipenta erythritol polyfunctional methacrylate. Herein, the polyfunctional acrylate is a compound having at least two of an acryloyl oxy group and/or a methacryloyl oxy group in the molecule.

Preferred examples of the monomer of polyfunctional acrylate include ethylene glycol diacrylate, diethylene glycol diacrylate, 1,6-hexanediol diacrylate, neopentylglycol diacrylate, trimethylolpropane triacrylate, trimethyloletthane triacrylate, tetramethylolmethane triacrylate, tetramethylolmethane tetraacrylate and so forth. These compounds may be used singly or in combination with two kinds. Further, the compound may be an oligomer such as a dimmer, a timer or the like of the above-described monomer.

The addition amount of the actinic ray curable resin is preferably at least 15% by weight and less than 70% by weight in the solid content in the polymer layer forming composition.

Further, the polymer layer preferably contains a photopolymerization initiator. As an amount of the photopolymerization initiator, it is preferable that in weight ratio, photopolymerization initiator: actinic ray curable resin=20:100 to 0.01:100.

Specific examples of the photopolymerization initiator include acetophenone, benzophenone, hydroxybenzophenone, mihiler ketone, α-amiroxim ester, and thio xanthone, and derivatives thereof, but the present invention is not specifically limited.

In the polymer layer, a binder such as a hydrophilic resin used for an intermediate layer, that is, a thermoplastic resin, a thermosetting resin or gelatin can be mixed in the above-described actinic ray curable resin to be used. Further, in order to adjust scratch resistance, lubrication and refractive index, particles made of an inorganic compound such as silicon oxide, or an organic compound may be contained.

As a polymer layer, for example, also usable is a curable resin in which a cross-linking agent such as a polyisocyanate compound or the like is used for a resin into which a hydroxyl group is introduced.

In the present invention, in the polymer layer, an antioxidant which does not inhibit photo-curable reaction is usable. As the antioxidant, a hindered phenol derivative, a thio propionic acid derivative, a phosphite derivative and so forth can be provided. Specific examples of the antioxidant include 4,4'-thiobis(6-tert-3-methyl phenol), 4,4'-butylidenebis(6-tert-butyl-3-methyl phenol), 1,3,5-tris(3,5-di-tert-butyl-4-hydroxybenzyl) isocyanurate, 2,4,6-tris(3,5-di-tert-butyl-4-hydroxybenzyl) mesitylene, di-octadecyl-4-hydroxy-3,5-di-tert-butyl benzyl phosphate, and so forth.

These polymer layers can be coated by a commonly known method such as a gravure coater, a dip coater, a reverse coater, a wire bar coater, a die coater or an ink jet method. The coating is followed by drying with heating, and a UV radiation curable treatment.

The polymer layer forming composition may contain a solvent, and may contain the solvent appropriately, if desired, so as to be diluted with it. An organic solvent contained in a coating solution may be selected appropriately from, for example, hydrocarbons (toluene, xylene); alcohols (methanol, ethanol, isopropanol, butanol, cyclohexanol); ketones (acetone, methyl ethyl ketone, methyl isobutyl ketone), esters (methyl acetate, ethyl acetate, methyl lactate), glycol ethers, and other organic solvents, or the selected solvents can be used as a mixed solvent. It may be desirable to use the above-described solvents which contain at least 5% by weight, more preferably 5-80% by weight of propylene glycol mono-alkyl ether (1-4 carbon atoms in an alkyl group) or propylene glycol mono-alkyl ether acetate (1-4 carbon atoms in an alkyl group).

It is preferable to add these components in the range of 0.01-3% by weight with respect to the solid content component in the coating solution.

After coating followed by drying, the polymer layer may be exposed to UV radiation. The exposure time to obtain a necessary amount of exposure to actinic rays may be 0.1 seconds to about one minute, and from the viewpoint of curing efficiency of a UV radiation curable resin or working efficiency, 0.1-10 seconds may be preferable.

Further, illuminance of the actinic ray exposure portion is preferably 0.05-0.2 W/m$^2$.

The polymer layer preferably has a thickness of 0.5-15 μm; more preferably has a thickness of 1-10 μm; and still more preferably has a thickness of 2-7 μm. When the thickness falls within this range, the coating layer exhibits sufficient durability, whereby excellent properties are produced.

The polymer layer of the present invention, which is made of a photo-curable or thermosetting resin as a main component contains a light stabilizer.

<<Light Stabilizer>>

Herein, the light stabilizer is one producing an effect of preventing a support or the like from deterioration caused by UV radiation exposure which has not been completely shielded by a UV radiation reflective layer, and examples thereof include a UV absorbent, a radical scavenger, an antioxidant and so forth. Usable examples of such a light stabilizer include organic light stabilizers such as a hindered amine based light stabilizer, a salicylic acid based light stabilizer, a benzophenone based light stabilizer, a benzotriazol based light stabilizer, a cyanoacrylate based light stabilizer, a triazine based light stabilizer, a benzoate based light stabilizer and an oxalic acid anilide based light stabilizer; and an inorganic light stabilizers such as sol-gel and so forth. Specific examples of preferably employable light stabilizers are shown below, but the present invention is not actually limited thereto.

A light stabilizer is preferably contained not only in a resin support but also in a polymer layer. As the stabilizer, preferably used is a UV absorbent.

In cases where a light stabilizer is contained in a polymer layer, the light stabilizer has a content of 0.1-30% by weight with respect to the binder, and preferably has a content of 5-20% by weight with respect to the binder. In the case of a content of less than 0.1% by weight, insufficient weather resistance (light) can be obtained, and in the case of a content exceeding 30% by weight, transparency of a polymer layer is unfavorably deteriorated.

Hindered amine based light stabilizers such as bis(2,2,6,6-tetramethyl-4-piperidyl)sebacate, and dimethyl succinate/1-(2-hydroxy ethyl)-4-hydroxy-2,2,6,6-tetra methyl piperidine polycondensation; salicylic acid based light stabilizers such as p-t-butyl phenyl salicylate, and p-octyl phenyl salicylate; benzophenone based light stabilizers such as 2,4-dihydroxy benzophenone, 2-hydroxy-4-methoxy benzophenone, 2-hydroxy-4-methoxy-5-sulfobenzophenone, 2, and 2'-4 and 4'-tetra hydroxy benzophenone, 2,2'-dihydroxy-4-methoxy benzophenone, a 2,2'-dihydroxy-4,4'-dimethoxy benzophenone, and bis(2-methoxy-4-hydroxy-5-benzoyl phenyl) methane; benzotriazol based light stabilizers such as 2-(2'-hydroxy-5'-methyl phenyl) benzotriazol, 2-(2'-hydroxy-5'-t-butylphenyl) benzotriazol, 2-(2'-hydroxy-3' and 5'-di-t-butylphenyl) benzotriazol, 2-(2'-hydroxy-3'-t-butyl-5'-methyl phenyl)-5-chlorobenzotriazole, 2-(2'-hydroxy-3' and 5'-di-t-butylphenyl)-5-chlorobenzotriazole, 2-(2'-hydroxy-5'-t-octylphenol) benzotriazol, 2-(2'-hydroxy-3' and 5'-di-t-amyl phenyl) benzotriazol, 2,2'-methylene bis[4-(1,1,3,3-tetramethylbutyl)-6-(2H-benzotriazol 2-yl) phenol], 2(2'hydroxy-5'-metaacryloxyphenyl)-2H-benzotriazol, 2-[2'-hydroxy-3'-(3",4",5",6"-tetrahydrophthalimidomethyl)-5'-methyl-phenyl] benzotriazol, 2-(2'-hydroxy-5-acryloyl oxy ethyl phenyl)-2H-benzotriazol, and 2-(2'-hydroxy-5'-methacryloxy ethylphenyl)-2H-benzotriazol, 2-(2'-hydroxy-3'-t-butyl-5'-acryloyl ethylphenyl)-5-chloro-2H-benzotriazol, cyanoacrylate based light stabilizers such as ethyl-2-cyano 3,3'-diphenyl acrylate; and light stabilizers other than those described above such as nickel bis(octyl phenyl)sulfide, [2,2'-thiobis(4-t-octylphenolate)]-n-butylamine nickel, nickel complex 3,5-di-t-butyl-mono-4-hydroxybenzylphosphorate ethylate, nickel.dibutyl dithiocarbamate, 2,4-di-t-butyl phenyl-3',5'-di.-butyl-4'-hydroxybenzoate, 2,4-di.t-butyl phenyl-3',5'-di.t-butyl-4'-hydroxybenzoate, 2-ethoxy-2'-ethyl oxyzac acid bisanilide, and 2-(4,6-diphenyl-1,3,5-tiazine 2-yl)-5-[(hexyl)oxy]-phenol.

In the present invention, it is desirable to use a UV absorbent or a hindered amine based light stabilizer, and it is still more preferable to use these in combination.

In the present invention, in order to easily form a coating layer such as a resin support, a polymer layer or the like, other resin components are appropriately mixed with respect to a light stabilizer in the coating layer to form a polymer layer. That is, it is preferred that a resin component and a light stabilizer are dissolved or dispersed in an organic solvent capable of dissolving the resin components and the light stabilizer, water, a mixture solution of at least 2 organic solvents, or a mixture solution of an organic solvent and water to use it in a coating liquid state. Further, one in which the resin component and the light stabilizer are separately dissolved or dispersed in advance in an organic solvent, water, a mixed organic solvent solution, or a mixture solution of an organic solvent and water may be appropriately mixed to use it. Further, a copolymer of a resin component and a light stabilizer component prepared in advance is preferably used as it is, as a coating material. Preferably used is one in which a copolymer is dissolved in an organic solvent, water, a mixture solution of at least 2 organic solvents or a mixture solution of an organic solvent and water. Resin components to be mixed or copolymerized are not specifically limited, but examples thereof include a polyester resin, a polyurethane resin, an acrylic resin, a methacrylic resin, a polyamide resin, a polyethylene resin, a polypropylene resin, a polyvinyl chloride resin, a polyvinylidene chloride resin, a polystyrene resin, a polyvinyl acetate resin, a fluorine based resin, and so forth. These resins may be used singly or may be used as at least 2 kinds of copolymers or a mixture thereof.

In the above-described resins, an acrylic resin or a methacrylic resin may be preferably selected to use it, and thither, one in which a light stabilizer component is copolymerized with an acrylic resin or a methacrylic resin is more preferably used for a coating layer. In the case of copolymerizing, an acrylic monomer component or a methacrylic monomer component is preferably polymerized with a light stabilizer monomer component.

As the light stabilizer monomer component, for example, a benzotriazol based reactive monomer, a hindered amine based reactive monomer, a benzophenone based reactive monomer and so forth are preferably usable. The benzotriazol based monomer may have benzotriazol in the base body moiety, and be a monomer having an unsaturated bond, and the present invention is not limited thereto, but examples thereof include 2-(2'-hydroxy-5-acryloyl oxy ethyl phenyl)-2H benzotriazol, 2-(2'-hydroxy-5'-methacryloxy ethylphenyl)-2H-benzotriazol, 2-(2'-hydroxy-3'-t-butyl-5'-acryloyl ethylphenyl)-5-chloro-2H benzotriazol and so forth.

Similarly, the hindered amine based reactive monomer and the benzophenone based reactive monomer have hindered amine and benzophenone, respectively in the base body moiety, and each of them is a monomer having an unsaturated bond. Examples of the hindered amine based reactive monomer include bis(2,2,6,6-tetramethyl-4-piperidyl 5-acryloyl oxy ethyl phenyl) sebacate, dimethyl-succinate.1-(2-hydroxy ethyl)-4-hydroxy-2,2,6,6-tetramethyl-5-acryloyl-oxy-ethyl-phenyl piperidine polycondensation, bis(2,2,6,6-tetramethyl-4-piperidyl 5-methacryloxy ethylphenyl) sebacate, dimethyl-succinate.1-(2-hydroxy ethyl)-4-hydroxy-2,2,6,6-tetramethyl-5-methacryloxy ethylphenylpiperidine polycondensation, bis(2,2,6,6-tetramethyl-4-piperidyl 5-acryloyl ethylphenyl) sebacate, dimethyl-succinate.1-(2-hydroxy ethyl)-4-hydroxy-2,2,6,6-tetramethyl-5-acryloyl ethylphenylpiperidine polycondensation.

Further, examples of the benzophenone based reactive monomer include 2-hydroxy-4-methoxy-5-oxyethyl phenyl benzophenone, 2 and 2'-4 and 4'-tetra-hydroxy-5-oxyethyl phenyl benzophenone, 2,2'-dihydroxy-4-methoxy-5-oxyethyl phenyl benzophenone, 2,2'-dihydroxy-4,4'-dimethoxy-5-oxyethyl phenyl benzophenone, 2-hydroxy-4-methoxy-5-methacryloxyethyl phenyl benzophenone, 2,2'-4, 4'-tetrahydroxy-5-methacryloxyethyl phenyl benzophenone, 2,2'-dihydroxy-4-methoxy-5-acryloyl ethyl phenyl benzophenone, 2,2'-dihydroxy-4,4'-dimethoxy-5-acryloyl ethyl phenyl benzophenone and so forth.

Examples of the acrylic monomer component or methacrylic monomer component copolymerized with a light stabilizer monomer component, or an oligomer component thereof include alkyl acrylate; alkyl methacrylate (as an alkyl group, i.e., a methyl group, an ethyl group, a n-propyl group, an isopropyl group, a n-butyl group, an isobutyl group, a t-butyl group, a 2-ethyl hexyl group, a lauryl group, a stearyl group, a cyclohexyl group and so forth); and monomers having each a cross-linking functional group, for example, monomers each having a carboxyl group, a methylol group, an acid anhydride group, a sulfonic acid group, an amide group, the methylol-produced amide group, an amino group, an alkylol-produced amino group, a hydroxyl group, an epoxy group, or the like. Further, the light stabilizer monomer components may be copolymerized with acrylonitrile, methacrylonitrile, styrene, butylvinyl ether, maleic acid, itaconic acid and its dialkyl ester, methyl vinyl ketone, vinyl chloride, vinylidene chloride, vinyl acetate, vinylpyridine, vinyl pyrrolidone, alkoxy silane having a vinyl group, unsaturated polyester, or the like.

The copolymerization ratio of the light stabilizer monomer component to the monomer to be copolymerized is not specifically limited, and at least one kind of each of them can be copolymerized at an arbitrary ratio, but the ratio of the light stabilizer monomer component is preferably at least 10% by weight, more preferably at least 20% by weight, and still more preferably 35% by weight. Further, the ratio is preferably 70% or less from the viewpoint of coatability and heat resistance. The light stabilizer monomer component may be a homopolymer. The molecular weight of each of these polymers is not specifically limited, but it may be usually at least 5,000, preferably at least 10,000, and most preferably at least 20,000 in view of toughness of the coating layer. These polymers are used in the state where the polymer is dissolved or dispersed in an organic solvent, water or a mixture solution of an organic solvent and water. In addition to the above-described polymers, a commercially available hybrid type light stabilizer polymer, for example, U-DOUBLE (produced by NIPPON SHOKUBAI Co., Ltd.) is usable.

In the cases where a polyester film is used as a resin film, a UV absorbent is preferably contained in the polyester film as a light stabilizer. Examples of the UV absorbent include a salicylic acid based compound, a benzophenone based compound, a benzotriazol based compound, a cyanoacrylate based compound, a triazine based compound, a benzoxazinone based compound, a cyclic imino ester based compound, and so forth, but from the viewpoint of UV radiation shielding ability at a wavelength of 380 nm, color tone and dispersibility in polyester, a triazine based compound and a benzoxazinone based compound are specifically preferable.

Further, these compounds can be used singly or in combination with at least two kinds. Furthermore, stabilizers such as HALS and an antioxidant can be also used in combination, and an antioxidant is preferably used in combination.

Herein, examples of the benzotriazol based compound include 2-(2H-benzotriazol 2-yl)-4,6-bis(1-methyl-1-phenylethyl)phenol, 2-(2H-benzotriazol 2-yl)-4-(1,1,3,3-tetramethylbutyl) phenol, 2-(2H-benzotriazol 2-yl)-4-methyl phenol, 2-(2H-benzotriazol 2-yl)-4,6-di-t-butyl phenol, 2-(2H-benzotriazol 2-yl)-4,6-di-t-amylphenol, 2-(2H-benzotriazol 2-yl)-4-t-butyl phenol, 2-(2'-hydroxy-3'-t-butyl-5'-methyl phenyl)-5-chlorobenzotriazole, and 2-(2'-hydroxy-3',5'-di-t-butylphenyl)-5-chlorobenzotriazole, and so forth.

Examples of the benzophenone based compound include 2-hydroxy-4-octhoxy benzophenone, 2-hydroxy-4-methoxy benzophenone, 2,2'-dihydroxy-4, a 4'-dimethoxy benzophenone, 2,2' and 4,4'-tetra-hydroxy-benzophenone, 2,4-dihydroxy-benzophenone, 2-hydroxy-4-methoxy benzophenone 5-sulfonic acid, and so forth.

Examples of the benzoxazinone based compound include 2-p-nitrophenyl-3,1-benzoxazine 4-one, 2-(p-benzoyl phenyl)-3,1-benzoxazine 4-one, 2-(2-naphthyl)-3,1-benzoxazine 4-one, 2,2'-p-phenylenebis (3,1-benzoxazine 4-one), and 2,2'-(2,6-naphtylene) bis(3,1-benzoxazine 4-one), and so forth.

<<UV Radiation Reflective Layer>>

It is a feature that a weather-resistant article of the present invention possesses a UV radiation reflective layer formed of plural materials each having a different refractive index, provided on at least one of both surfaces of a support. The UV radiation reflective layer is typically composed of a laminate in which layers each made of a material having a different refractive index are alternatingly laminated, and optically designed so as to reflect UV radiation, but this is not limited to a laminate, and the mixing ratio of plural materials each having a different refractive index may be sloped in the film thickness direction so as to reflect UV radiation. Further, as to the film having the same component, the ratio of the main component may be sloped in the film thickness direction. Further, the UV radiation reflective layer may be separately provided from the after-mentioned water vapor barrier layer, but the UV radiation reflective layer is possible to serve as a water vapor barrier layer.

The UV radiation reflective layer is referred to as one in which reflectance is enhanced by making reflected light from an interface above and below a coating layer to be in phase, with respect to UV rays in the vicinity of a wavelength of $\lambda$, by coating a transparent dielectric material (refractive index: n) so as to give a thickness of $\lambda/2n$ (nm), for example, with respect to wave length of UV radiation reaching the earth, that is, a specific wavelength of $\lambda$ in the range of 290-400 nm.

For example, not only reflectance can be raised, but also the reflection wavelength range can be extended by alternatingly multilayer-coating films each made of a different dielectric material as a high refractive index layer and a low refractive index layer. For example, a UV radiation reflective layer having 15 layers (a total thickness of 685 nm) in which high refractive index layer ($TiO_2$, n=2.10, and a thickness of 35 nm) and low refractive index layer ($SiO_2$, n=1.4, and a thickness of 55 nm) are sequentially provided on a transparent film reflects approximately 95% of UV radiation having a wavelength of 300-360 nm, adversely affecting a resin support in particular. (Characteristics of reflectance and transmittance of the UV radiation reflective layer are shown in FIG. 1.) UV rays transmitting a support can be shielded by providing such a UV radiation reflective layer.

As a dielectric material for the foregoing UV radiation reflective layer, a material containing metal oxide, nitrogen oxide or nitride is suitably usable. A high refractive index layer having a refractive index of 1.8-2.4 is preferably composed of at least one layer containing oxide, nitrogen oxide or nitride containing at least Zn, Ti, Sn, In, Nb, Si, Ta or Al. A low refractive index layer having a refractive index of 1.4-1.8 is made of oxide, nitrogen oxide or nitride as a main component containing at least Si or Al, and in particular, is preferably made of silicon oxide.

As a method of forming the dielectric material, a vapor deposition method is preferable, and further, preferred examples thereof include a vacuum evaporation method, a sputtering method, an ion plating method, a catalyst chemical vapor deposition (Cat-CVD) method and a plasma CVD method. Specifically, a film prepared by a thin film forming method by which a gas containing a thin film forming gas and a discharge gas are supplied into a discharge space under the atmospheric pressure or a pressure close to the atmospheric pressure to form a high-frequency electric field in the discharge space so as to excite the gas, and the resin support is exposed to the excited gas to form a thin film on the resin support, that is, a film formed by a so-called atmospheric pressure plasma CVD method is preferable in view of low residual stress. A material being fluoride of calcium, barium, lithium or magnesium as a main component is also usable for a low refractive index layer. Further, in the present invention, among layers each having a refractive index, at least one of the layers can be designed to be a layer having a graded structure.

The foregoing UV radiation reflective layer is preferably composed of a structure of at least 3 layers in which at least a high refractive index layer, a low refractive index layer and a low refractive index layer are provided in order, wherein the low refractive index layer has a refractive index of 1.4-1.8 and a thickness of 5-1000 nm and the high refractive index layer has a refractive index of 1.8-2.4 and a thickness of 5-400 nm. The foregoing UV radiation reflective layer is more preferably composed of a structure of at least 5 layers, and most preferably composed of a structure of at least 7 layers <<Water Vapor Barrier Layer>>

A weather-resistant article of the present invention may possess at least one water vapor barrier layer. The water vapor bather layer means a layer having low water gas permeability. The water vapor barrier layer preferably has a water vapor permeability (JIS K7129-1992 B method, under the condition of 40° C. and 90% RH) of 0.1 g/($m^2 \cdot 24$ h) or less. Further, the water vapor barrier layer preferably has a water vapor permeability (JIS K7129-1992 B method, under the condition of 40° C. and 90% RH) of 0.01 g/($m^2 \cdot 24$ h) or less.

The water vapor bather layer used in the present invention preferably possesses at least one metal oxide layer made of oxide, nitrogen oxide or nitride containing Si or Al, as a main component. It is preferred to provide a water vapor barrier layer, since influence of moisture and heat can be eliminated.

As a method of forming a water vapor bather layer, a vapor deposition method is preferable, and further, preferred examples thereof include a vacuum evaporation method, a sputtering method, an ion plating method, a catalyst chemical vapor deposition (Cat-CVD) method and a plasma CVD method. Specifically, a film prepared by a thin film forming method by which a gas containing a thin film forming gas and a discharge gas are supplied into a discharge space under the atmospheric pressure or a pressure close to the atmospheric pressure to form a high-frequency electric field in the discharge space so as to excite the gas, and the resin support is exposed to the excited gas to form a thin film on the resin support, that is, a film formed by a so-called atmospheric pressure plasma CVD method is preferable in view of low residual stress.

The atmospheric pressure plasma method and formation of a water vapor barrier layer made of oxide, nitrogen oxide or nitride containing Si or Al, as a main component by the atmospheric pressure plasma method will be described later.

The water vapor barrier layer used in the present invention preferably has a refractive index of 1.4-1.8 as a low refractive index. When the refractive index is set to less than 1.8, a low refractive index layer can be designed relatively freely in order to improve durability and handling ability without hardly affecting visible light transmittance and UV radiation reflectance. On the other hand, when the refractive index becomes less than 1.3, a film becomes less dense, resulting in no improvement in durability. Further, in the case of a low refractive index, a UV radiation reflective layer as a low refractive index layer can provide a water vapor bather layer. Further, the water vapor bather layer may contain a light stabilizer to shield UV radiation.

In the present invention, the foregoing water vapor barrier layer is preferably composed of silicon oxide films, and preferably possesses at least one silicon oxide film having a carbon content and at least one silicon oxide film having another different carbon content.

In the case of film formation by a vapor deposition method, though the silicon oxide films approximately has the same composition, for example, in the case of an atmospheric pressure plasma CVD method, the filling degree of silicon oxide particles and impurity particles mixed to be slightly mixed depend on the manufacturing condition or thin film forming gas to be used (i.e., kinds of raw stock gas and additive gas, a ratio thereof, and so forth), whereby physical properties such as density and so forth tend to undergo a change.

The water vapor barrier layer of the present invention is preferably placed on the inner side from the foregoing UV radiation reflective layer with respect to the incoming side of UV radiation. When the water vapor barrier layer is placed on the inner side from the foregoing UV radiation reflective layer with respect to the incoming side of UV radiation, in the case of employing oxide containing carbon in one of the water vapor barrier layers, degradation of this film caused by UV radiation in an outdoor location for a long duration can be protected, and the UV radiation reflective layer serves as a hard coat layer, whereby scratches and cracks produced in the UV radiation reflective layer can be eliminated. The water vapor barrier layer is preferably placed on the incoming side of UV radiation from the resin support. By using this, weather resistance of the resin support can be improved, since oxygen and moisture adversely affecting deterioration caused by light such as yellowish change of a resin can be shielded from the resin support.

The refractive index of a water vapor barrier layer is preferably 1.3 or more and less than 1.8, but a value obtained by an X-ray reflectance method is specifically used for the refractive index of an silicon oxide film, for example.

(X-Ray Reflectance Method)

The X-ray reflectance method can be used by referring to an outline of "X-ray Diffraction Handbook" page 151 (edited by Rigakudenki Co., Ltd., 2000, International Academic Printing Co., Ltd.) or Kagaku Kogyo No. 22, Jan. 1999.

A specific example of a measuring method useful in the present invention will be described below.

This measurement is conducted by making X-rays to enter a material whose surface is flat at a very shallow angle, employing MXP 21 manufactured by Mac Science Corp. as a measuring device. Copper is used as a target for an X-ray source, and operation is made at 42 kV and 500 mA. A multilayer film parabola mirror is used in an incident monochromater. A slit for incoming light having a size of 0.05 mm×5 mm and a light receiving slit having a size of 0.03 mm×20 mm are employed. The measurements are conducted by a FT method with a step width of $0.005°$ and a step of 10 seconds for one step for a range of 0-5° by a $2\theta/\theta$ by scanning method. The resulting reflectance curve is subjected to curve-fitting employing Reflectivity Analysis Program Ver. 1 produced by Mac Science Corp. to obtain each parameter in such a way that the residual sum of squares of the measured value and the fitting curve is minimized. The refractive index, thickness and density of the multilayer film can be obtained from each parameter.

Density of the silicon oxide film shows close correlation with carbon content as a slight component amount. For example, a film having a low carbon atom concentration (less than 0.1 at %) is a film exhibiting high density and having a high gas barrier property, but a film having a carbon atom concentration higher than this (1 to 40 at %) exhibits film density also being lower, and is a soft composition.

In the present invention, carbon content (at %) of water vapor barrier layer represents atomic number concentration % (atomic concentration).

The atomic number concentration % (atomic concentration) as a carbon content can be obtained by a commonly known analysis technique, but in the present invention, it is calculated by the following XPS method, and is defined as shown below.

Atomic number concentration % (atomic concentration)= (the number of carbon atoms/the total number of atoms)×100

In the present invention, ESCALAB-200R manufactured by VG Scientific Corp. was used as an XPS surface analyzer. Specifically, Mg was used for an X-ray anode and the measurement was carried out at an output of 600 W (an accelerating voltage of 15 kV, and an emission current of 40 mA). Energy resolving power was set to 1.5-1.7 eV when it was defined by a half-value width at a clean Ag3d5/2 peak.

In the measurement, first, a bond energy range of 0-1100 eV was measured at a data sampling interval of 1.0 eV, and what kinds of elements were detected were determined.

Next, as to all the detected elements excluding etching ion species, employing a data sampling interval of 0.2 eV, narrow scanning was conducted with respect to a photoelectron peak to provide the maximum intensity to measure a spectrum of each element.

In order to eliminate differences in content ration calculation results depending on measuring devices or computers, the resulting spectrum was transferred to COMMON DATA PROCESSING SYSTEM, manufactured by VAMAS-SCA-JAPAN Corp. (preferably Ver. 2.3 or later version) and subsequently processed by the same software as described above to obtain the value of a content ratio of each target element (carbon, oxygen, silicon, titanium or the like) as atomic number concentration (atomic concentration: at %).

Before conducting quantitative analysis, calibration in Count Scale was carried out for each element to conduct a smoothing treatment with 5 points. In the quantitative analysis, peak area intensity (cps*eV) in which the background was eliminated was used. In the background processing, a method of Shirley was used. Concerning the Shirley method, cited can be D. A. Shirley, Phys. Rev., B5, 4709 (1972).

Concerning a method of manufacturing the first silicon oxide film, the second silicon oxide film or the third silicon oxide film, for example, in the water vapor bather layer of the present invention, described is a raw material compound used in a manufacturing method specifically by an atmospheric plasma CVD method among vapor deposition methods.

As to silicon oxide film, the composition of a ceramic layer made of oxide, nitrogen oxide or nitride containing Si or Al as a main component can be separately prepared via selection of the conditions in the atmospheric pressure plasma CVD method, such as an organometallic compound as raw material (also, referred to as basic substance), decomposition gas, decomposition temperature and supplied electric power.

For example, when a silicon compound is used as a raw material compound and oxygen is used as a decomposition gas, silicon oxide is produced. When silazane or the like is also used as a raw material compound, silicon oxide nitride is produced. The reason is that since very active charged particles and active radicals are present in high density in a plasma space, multistage chemical reactions are accelerated at high speed in the plasma space, whereby elements existing in the plasma space are converted into a thermodynamically stable compound in a very short period of time.

As raw material to form such a silicon oxide film, any of states of gas, liquid and solid at ordinary temperatures and pressures may be allowed, as long as the raw material is a silicon compound. In the case of gas, the raw material as it is can be introduced into a discharge space, but in the case of liquid or solid, the raw material is used by vaporizing it via heat, bubbling, reduced pressure, exposure to ultrasonic waves or the like. Further, the raw material may be used by being diluted with a solvent, and examples of the solvent include organic solvents such as methanol, ethanol, and n-hexane and so forth, and a mixed solvent of thereof. In addition, since the diluted solvent is decomposed in the form of molecules or atoms during the plasma discharge treatment, influence thereof can be almost neglected.

Examples of such a silicon compounds include silan, tetra methoxy silan, tetra ethoxy silan, tetra n-propoxy silan, tetra isopropoxy silan, tetra n-butoxy silan, tetra t-butoxy silan, dimethyldimethoxy silan, dimethyldiethoxy silan, diethyldimethoxy silan, diphenyldimethoxy silan, methyl triethoxy silan, ethyl trimethoxy silan, phenyl triethoxy silan, (3,3,3-trifluoropropyl) trimethoxy silan, hexamethyl disiloxan, bis(dimethylamino) dimethyl silan, bis(dimethylamino) methylvinyl silan, bis(ethylamino) dimethyl silan, N,O-bis(trimethyl silyl) acetamide, bis(trimethyl silyl) carbodiimide, diethyl aminotrimethyl silan, dimethylamino dimethyl silan, hexamethyl disilazan, hexamethyl cyclotrisilazan, heptamethyl disilazan, nonamethyl trisilazan, octamethylcyclo tetrasilazane, tetrakis dimethylamino silan, tetraisocyanate silan, tetramethyl disilazan, tris (dimethylamino) silan, triethoxyfluoro silan, allyldimethyl silan, allyl trimethyl silan, benzyl trimethyl silan, bis(trimethyl silyl) acetylene, 1,4-bistrimethyl silyl-1,3-butadiyn, di-t-butyl silan, 1,3-disilabutan, bis(trimethyl silyl)methan, cyclopentadienyl trimethyl silan, phenyl dimethyl silan, phenyl trimethyl silan, propargyl trimethyl silan, tetramethyl silan, trimethyl silyl acetylene, 1-(trimethyl silyl)-1-propyn, tris(trimethyl silyl) methan, tris(trimethyl silyl)silan, vinyl trimethyl silan, hexamethyl disilan, octamethyl cyclotetrasiloxan, tetramethyl cyclotetrasiloxan, hexamethyl cyclotetrasiloxan, M silicate 51, and so forth.

Examples of aluminum compounds include aluminium ethoxide, aluminium tiisopropoxide, aluminium isopropoxide, aluminium n-butoxide, aluminium s-butoxide, aluminium t-butoxide, aluminium acetylacetonato, triethyl dialuminium tri-s-butoxide, and so forth.

Further, examples of decomposition gas to decompose the raw material gas containing silicon or aluminum so as to obtain a silicon oxide film or an aluminum oxide film include hydrogen gas, methane gas, acetylene gas, carbon monoxide gas, carbon dioxide gas, nitrogen gas, ammonia gas, nitrous oxide gas, nitrogen oxide gas, nitrogen dioxide gas, oxygen gas, steam, fluorine gas, hydrogen fluoride, trifluoroalcohol, trifluorotoluene, hydrogen sulfide, sulfur dioxide, carbon disulfide, chlorine gas and so forth.

For example, raw material gas containing silicon and decomposition gas are appropriately selected to obtain a silicon oxide film containing silicon oxide, nitride, carbide or the like.

In a plasma CVD method, a discharge gas which produces a plasma state easily is mainly mixed with the reactive gases, and the resulting gas is fed into a plasma discharge generator. As such a discharge gas, at least one of nitrogen gas and the 18th group element in a periodic table such as helium, neon, argon, krypton, xenon, radon or the like is employed. Among them, nitrogen, helium, and argon are specifically preferable.

The above-described discharge gas and a reactive gas are mixed, and are fed to a plasma discharge generator (plasma generation apparatus) as a thin film forming (mixed) gas to form a film. A ratio of the discharge gas and the reactive gas depend on a film property to be obtained, but the reactive gas is supplied in such a way that the ratio of the discharge gas to the whole mixed gas is set to 50% or more.

In the laminated silicon oxide film constituting the foregoing water vapor barrier layer, for example, oxygen gas or nitrogen gas is used in combination with the above-described organosilicon compound in a predetermined ratio to obtain a silicon oxide film mainly made of silicon oxide in the present invention containing an Si atom and at least one of an O atom and an N atom.

The water vapor barrier layer is preferably one in which one unit composed of the first silicon oxide film and the second silicon oxide film described before is formed on a resin support, and two units or more may be formed on the resin support. As an example, there is a configuration in which only one unit consisting of the first silicon oxide film and the second silicon oxide film is formed on the resin support, or, for example, there is another configuration in which two or three units each composed of the first silicon oxide film and the second silicon oxide film are formed on the resin support.

Each silicon oxide layer in the water vapor barrier layer may have a thickness of 1-500 nm.

The water vapor barrier layer as a whole preferably has a thickness of from 10 nm to 5 µm.

Next, the atmospheric pressure plasma CVD method will be described in detail.

In order to form a ceramic layer of the present invention, for example, a silicon oxide layer, a titanium oxide layer as a metal oxide layer, or a laminate composed of these layers, physical or chemical vapor deposition methods are utilized. An atmospheric plasma CVD method as the most preferable method among them will be described below.

The atmospheric plasma CVD method is described in, for example, Japanese Patent O.P.I. Publication No. 10-154598, Japanese Patent O.P.I. Publication No. 2003-49272 and the pamphlet of WO 02/048428, and after gas containing thin film forming gas and discharge gas is supplied into a discharge space under the atmospheric pressure or a pressure close to the atmospheric pressure, a high-frequency electric field is formed in the discharge space to excite the gas, and a thin film is formed via exposure to the excited gas.

Specifically, the thin film forming method described in Japanese Patent O.P.I. Publication No. 2004-68143 is preferable in order to form a dense ceramic layer. Further, layers each having a different composition can be continuously formed while unwinding a web-shaped resin support from a stock roll.

High-frequency means a frequency of at least 0.5 kHz.

The above-described atmospheric pressure plasma CVD method employed to form a ceramic layer of the present invention is a plasma CVD method conducted under the atmospheric pressure or a pressure close to the atmospheric pressure. The atmospheric pressure or a pressure close to the atmospheric pressure is approximately a pressure of 20-110 kPa, and preferably a pressure of 93-104 kPa in order to obtain excellent effects described in the present invention.

As for the discharge condition of the present invention, the high-frequency electric field preferably has a frequency of 1 kHz-2500 MHz, together with a supplied electric power of 1-50 W/cm$^2$, and more preferably has a frequency of at least 50 kHz, together with a supplied electric power of at least 5 W/cm$^2$. Further, more preferable is one in which at least two electric fields each having a different frequency are applied in the discharge space, and superimposed.

Superimposition of continuous waves such as sine waves was described above, but the present invention is not limited thereto, and both waves may be pulse waves, or one waves may be continuous waves and the other waves may be pulse waves. Further, the third electric field having a different frequency may be used.

A specific method by which the above-described high-frequency electric field of the present invention is formed in the same discharge space is one employing an atmospheric pressure plasma discharge treatment apparatus in which, for example, the first power supply to form a high-frequency electric field having a frequency of ω1 is connected to the first electrode constituting the facing electrode, and the second power supply to form a high-frequency electric field having a frequency of ω2 is connected to the second electrode.

Herein, the first power supply has a frequency of 1 kHz-1 MHz, and preferably has a frequency of 200 kHz or less. Further, as a waveform thereof, continuous waves as well as pulse waves may be allowed to be used.

On the other hand, the second power supply has a frequency of 1 MHz-2500 MHz, and preferably has a frequency of at least 800 kHz. The higher the frequency of the second power supply, the higher the plasma density is, and excellent dense thin films can be obtained.

Further, the first filter to make current of high-frequency electric field from the second power supply to be difficult to pass through is preferably connected to the first electrode and the first power supply, or one of them, and the second filter is preferably connected to the second electrode and the second power supply, or one of them.

In the present invention, discharge start electric field strength means the lowest electric field strength which can generate discharge in the discharge space and the reaction condition (gas condition and so forth) used in a practical thin film forming method. The discharge start electric field strength fluctuates slightly depending on gaseous species and dielectric species of the electrode supplied into the discharge space, or the distance between electrodes, but in the same discharge space, it is dominated by the discharge start electric field strength of discharge gas.

Herein, applied electric field strength and "discharge start electric field strength are referred to as those measured by the following method.

Measuring Method of Applied Electric Field Strength VI and Applied Electric Field Strength V2 (Unit: kV/mm):

A high-frequency voltage probe (P6015A) is provided to each electrode section, and the output signal of the high-frequency voltage probe is connected to oscilloscope (TDS3012B, produced by Tektronix, Inc.) to measure electric field strength at the predetermined time.

Measuring Method of Discharge Start Electric Field Strength IV (unit: kV/mm):

After discharge gas is supplied between electrodes, electric filed strength between these electrodes is increased, and the electric field strength at which discharge starts is defined as electric discharge start electric field strength IV. The measuring device is the same device as used in the above-described applied electric field strength measurement.

The above-described atmospheric pressure plasma discharge treatment apparatus possesses a gas supply device to supply a discharge gas and a thin film forming gas in between facing electrodes. Further, the atmospheric pressure plasma discharge treatment apparatus preferably possesses an electrode temperature adjustment device to control temperature of the electrode.

The atmospheric pressure plasma discharge treatment apparatus used in the present invention, as described above, generates discharge between facing electrodes so as to make the gas introduced between the foregoing facing electrodes to be in a plasma state, and a support placed unmoved between the foregoing facing electrodes or a support conveyed between the facing electrodes is exposed to the gas in the plasma state to form a thin film on the support. Further, there is a jet system apparatus as another system with which the atmospheric pressure plasma discharge treatment apparatus generates discharge between the same facing electrodes as described above so as to excite the gas introduced between the facing electrodes or to make the gas to be in a plasma state blows the gas excited or in the plasma state in the form of a jet into the outside of the facing electrodes, and exposes a support (which may be placed unmoved or conveyed) in the vicinity of the facing electrodes to the gas to form a thin film on the support.

Figure 2:
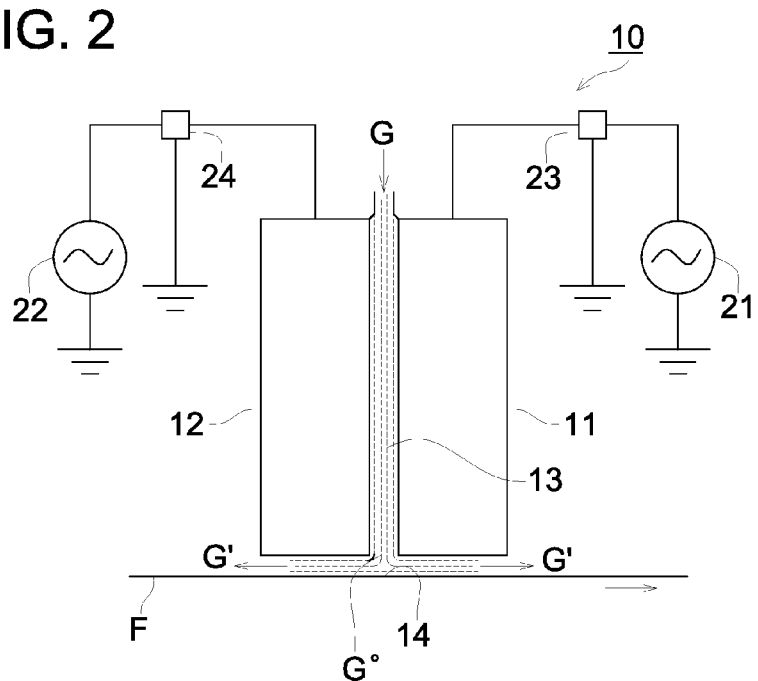
FIG. 2 is a schematic view showing one example of the jet system atmospheric pressure plasma discharge treatment apparatus useful in the present invention.

FIG. 2 is a schematic view showing one example of the jet system atmospheric pressure plasma discharge treatment apparatus useful in the present invention.

The jet system atmospheric pressure plasma discharge treatment apparatus is an apparatus possessing a gas supply device, and an electrode temperature adjustment device in addition to a plasma discharge treatment apparatus and an electric field application device equipped with two power supplies.

Plasma discharge treatment apparatus 10 is equipped with facing electrodes as first electrode 11 and second electrode 12, and between the facing electrodes, high-frequency electric field having a frequency of ω1 from first power supply 21 is designed to be formed by first electrode 11, and high-frequency electric field having a frequency of ω2 from second power supply 22 is designed to be formed by second electrode 12.

Figure 3:
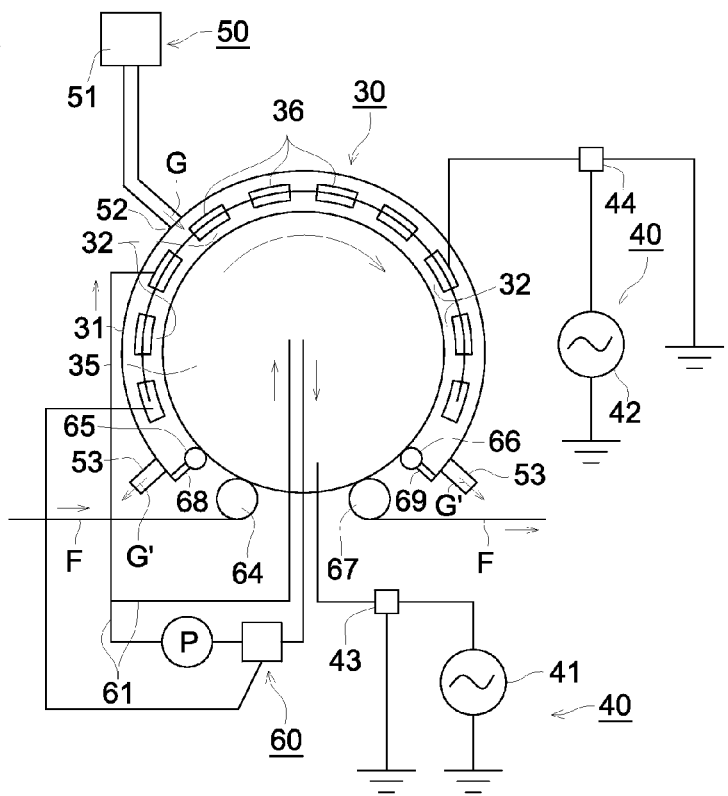
FIG. 3 is a schematic view showing one example of an atmospheric pressure plasma discharge treatment apparatus as a system by which a support is treated between facing electrodes useful in the present invention.
Figure 4:
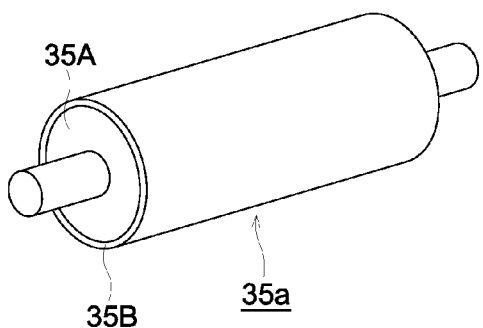
FIG. 4 is a perspective view showing one example of a structure of a conductive metallic support for a roll rotating electrode and of a dielectric coated thereon.

Foregoing thin film forming gas G is introduced in between the facing electrodes (discharge space) 13 as first electrode 11 and second electrode 12 from a gas supply device as shown in the after-mentioned FIG. 4. The foregoing high-frequency electric field is formed between first electrode 11 and second electrode 12 by first power supply 21 and second power supply 22 to generate discharge, and after the resulting gas is blown out in the form of a jet onto the lower side (below the sheet plane) of the facing electrodes while making foregoing thin film forming gas G to be in a plasma state, a treating space formed between the lower surface of the facing electrode and support F is filled with gas G° in the plasma state. Subsequently, a thin film is formed in the vicinity of treatment position 14 on support F conveyed from a stock roll (unwinder) of the support which is not shown, or conveyed from the previous process. During thin film formation, electrodes are heated or cooled by a medium passing through a pipe from an electrode temperature adjustment device as shown in the after-mentioned FIG. 3. Since matter properties and compositions of the resulting thin film tend to vary, depending on the temperature of the support during plasma discharge treatment, appropriate control is desired to be made with respect to the foregoing. As a medium for temperature adjustment, preferably employed is an insulation material such as distilled water, oil or the like. During plasma discharge treatment, internal temperature of the electrodes is desired to be evenly adjusted so as not to produce temperature unevenness in the width direction or in the longitudinal direction of a support.

When a plurality of jet system atmospheric plasma discharge treatment apparatuses are placed parallelly in the conveying direction of resin support F, and gases each in the same plasma state are simultaneously discharged, a thin film composed of plural layers is possible to be formed in the same location, and a desired film thickness is possible to be formed for a short duration. Further, when a plurality of the apparatuses are placed parallelly in the conveying direction of resin support F, a different thin film forming gas is supplied in each of the apparatuses to jet-blow out the gas in a different plasma state, a laminate thin film composed of different layers can also be formed.

FIG. 3 is a schematic view showing one example of an atmospheric pressure plasma discharge treatment apparatus as a system by which a support is treated between facing electrodes useful in the present invention.

The atmospheric pressure plasma discharge treatment apparatus is an apparatus possessing at least plasma discharge treatment apparatus 30, electric field application device 40 equipped with two power supplies, gas supply device 50, and electrode temperature adjustment device 60.

Resin support F is subjected to a plasma discharge treatment to form a thin film between facing electrodes (hereafter, referred to also as discharge space 32) as roll rotating electrode (the first electrode) 35 and fixed electrode group (the second electrode) 36.

In discharge space 32 formed between roll rotating electrode 35 and fixed electrode group 36, a high-frequency electric field having a frequency of $\omega 1$ from first power supply 41 is designed to be applied to roll rotating electrode 35, and another high-frequency electric field having a frequency of $\omega 2$ from second power supply 42 is designed to be applied to fixed electrode group 36.

In addition, in the present invention, roll rotating electrode 35 may be used as the second electrode, and fixed electrode group 36 may also be used as the first electrode. Either way, the first power supply is connected to the first electrode, and the second power supply is also connected to the second electrode.

Thin film forming gas G generated by gas generator 51 for gas supply device 50 is introduced into plasma discharge treatment chamber 31 from gas feeding port 52 by controlling the flow rate with an gas flow rate adjustment device.

Support F is unwound from an unshown stock roll, and conveyed, or support F is conveyed in the arrowed direction from the previous process. Then, after blocking air or the like accompanied with the support with nip roller 65 via rill rotating electrode 35, support F is conveyed into a space about fixed electrode group 36 while being brought into contact with roll rotating electrode 35 and winding it.

During conveyance, electric fields are applied from both roll rotating electrode 35 and fixed electrode group 36 to generate discharge plasma between facing electrodes (discharge space) 32. While support F is brought into contact with roll rotating electrode 35 and is wound, a thin film is formed with the gas in the plasma state.

In addition, as the number of fixed electrodes, a plurality of fixed electrodes are places along the circumference larger than that of the above-described roll rotating electrode, and the discharge area of the electrode is calculated as the sum of the areas of the surfaces facing roll rotating electrode 35 of all the fixed electrodes facing roll rotating electrode 35.

After resin support F passes through nip roll 66 and guide roll 67, it is wound by an unshown winder, or is conveyed to the following process.

Exhaust gas G' having been subjected to a discharge treatment is discharged from exhaust gas port 53.

In order to heat or cool roll rotating electrode 35 and fixed electrode group 36 during formation of a thin film, a medium whose temperature has been adjusted by electrode temperature adjustment device 60 is fed to the both electrodes through pipe 61 by liquid supply pump P to adjust temperature from the inside of the electrode. In addition, numerals 68 and 69 are partition plates to separate plasma discharge treatment chamber 31 from the outside.

FIG. 4 is a perspective view showing one example of a structure of a conductive metallic support for a roll rotating electrode shown in FIG. 3, and of a dielectric coated thereon.

In FIG. 4, roll electrode 35a possesses conductive metallic base martial 35A and dielectric 35B coated thereon. Further, in order to control electrode surface temperature during plasma discharge treatment, and to maintain surface temperature of resin support F at a predetermined value, designed is a structure in which a medium (water, silicone oil or the like) for temperature adjustment can be circulated.

Figure 5:
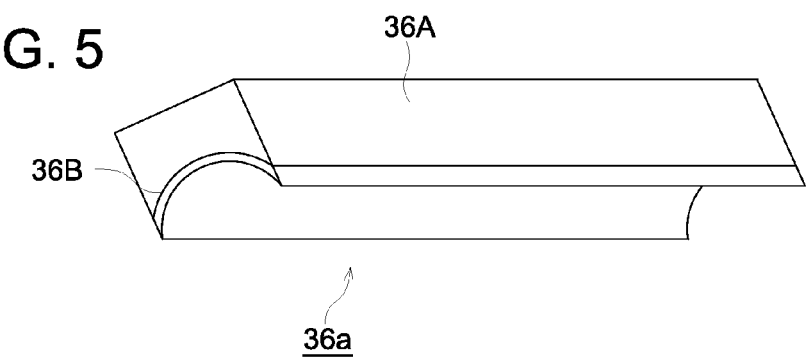
FIG. 5 is a perspective view showing one example of a structure of a conductive metallic support for a fixed electrode and of a dielectric coated thereon.

FIG. 5 is a perspective view showing one example of a structure of a conductive metallic support for an electrode and a dielectric coated thereon. Though the electrode structure is not shown, it is designed to be a jacket structure to control temperature during discharge.

In FIG. 5, fixed electrode 36a possesses a coat of dielectric 36B provided onto conductive metallic support 36A, similarly to FIG. 4.

Shape of fixed electrode 36a shown in FIG. 5 is not specifically limited, and it may be a cylinder type electrode or it may also be a square cylinder type electrode.

In FIGS. 4 and 5, roll electrode 35a and electrode 36a are subjected to a sealing treatment employing a sealing material made of an inorganic compound after thermally spraying ceramics as dielectric 35B and dielectric 36B onto conductive metallic support 35A and conductive metallic support 36B, respectively. The ceramic as a dielectric may have a thickness of roughly 1 mm on only one side. As the ceramic material used for thermally spraying, alumina, silicon nitride and so forth are preferably employed, but alumina is specifically preferable, since it is easily processed. Further, the dielectric layer may be a lining-treated dielectric in which an inorganic material is provided via lining.

Examples of conductive support 35A and conductive support 36B include titanium metal, titanium alloys, metals such as silver, platinum, stainless steel, aluminum, iron and so forth, composite materials of iron and ceramics, and composite materials of aluminum and ceramics.

When a dielectric is provided on another electrode, an electrode distance between the first electrode and the second electrode means a shortest distance between the dielectric surface and the surface of the conductive metallic support of another electrode. When dielectrics are provided on both electrodes, it means a shortest distance of the distance of dielectric surface-to-dielectric surface. The electrode distance between the electrodes is determined in consideration of thickness of the dielectric provided on the conductive metallic support, applied electric field strength, the purpose of utilizing plasma and so forth, but in any case, from the viewpoint of evenly discharging, the electrode distance is preferably 0.1-20 mm, and more preferably 0.5-5 mm.

As plasma discharge treatment chamber 31, a treatment chamber made of a PYREX (the registered trademark) glass or the like is preferably used, but when insulation with respect to an electrode is realized, a metal chamber is possible to be used. For example, a polyimide resin or the like may be attached onto the inner surface of a frame made of aluminum or stainless steel, or ceramics may be thermally sprayed onto the metal frame to realize insulation. In FIG. 3, both sides (up to close to the support surface) of both electrodes placed parallel to each other are preferably covered with the material as described above.

As the first power supply (high-frequency power supply) installed in an atmospheric pressure plasma discharge treatment apparatus, preferably usable is any of those commercially available such as SPG5-4500 (5 kHz) manufactured by Shinko Electric Co., Ltd., AGI-023 (15 kHz) manufactured by Kasuga Electric Work Ltd., PHF-6k (100 kHz *) manufactured by Haiden Laboratory, Inc., CF-2000-200k (100 kHz) manufactured by Pearl Kogyo Co., Ltd., and so forth.

As the second power supply (high-frequency power supply), preferably usable is any of those commercially available such as CF-2000-800k (800 kHz) manufactured by Pearl Kogyo Co., Ltd., CF-5000-13M (13.56 MHz) manufactured by Pearl Kogyo Co., Ltd., CF-2000-150M (150 MHz) manufactured by Pearl Kogyo Co., Ltd., and so forth.

In addition, among the above-described power supplies, the power supply provided with asterisk mark * is a high-frequency power supply (100 kHz in continuous mode) manufactured by Haiden Laboratory, Inc. Power supplies other than that are high-frequency power supplies each by which only continuous sine waves are possible to be applied.

In the present invention, an electrode which can maintain an evenly stable discharge state via application of such an electric field is preferably utilized in an atmospheric pressure plasma discharge treatment apparatus.

In the present invention, electric power applied between facing electrodes supplies an electric power (output density) of 1 W/cm$^2$ or more to the second electrode (the second high-frequency electric field) so as to excite the discharge gas and to generate plasma, and energy is given to the thin film forming gas to form a thin film. The upper limit of the electric power supplied to the second electrode is preferably 50 W/cm$^2$, and more preferably 20 W/cm$^2$. The lower limit is preferably 1.0 W/cm$^2$. In addition, discharge area (cm$^2$) means an area in a range in which discharge is generated between electrodes.

Further, an electric power (output density) of 1 W/cm$^2$ or more to the second electrode can also be applied to the first electrode (the first high-frequency electric filed) to improve enhanced film quality. The electric power is preferably 5 W/cm$^2$ or more. The upper limit of the electric power supplied to the first electrode is preferably 50 W/cm$^2$.

Herein, the waveform of a high-frequency electric field is not specifically limited. The waveform includes a sine wave continuous oscillation mode called a continuous mode and an intermittent oscillation mode called a pulse mode performing ON/OFF intermittently, and any one of them may be used, but it is preferred that continuous sine waves are applied on at least the second electrode side (the second high-frequency electric field), since more dense and excellent films can be obtained.

In the present invention, it is preferred that a gas containing a thin film forming gas and a discharge gas is supplied into a discharge space under an atmospheric pressure or a pressure close to the atmospheric pressure; a high-frequency electric field is formed in the discharge space so as to excite the gas; and the object was exposed to the excited gas to fowl a water vapor barrier layer as well as a UV radiation reflective layer by a thin film forming method.

Further, it is preferred that the discharge gas is nitrogen gas; the high-frequency electric field applied to the discharge space is a high-frequency electric field obtained by superimposing the first high frequency-electric field and the second high-frequency electric field; frequency ω2 of the second high-frequency electric field is higher than frequency ω1 of the first high-frequency electric field; the relationship among first high-frequency electric field intensity V1, second high-frequency electric field intensity V2, and discharge starting electric field intensity IV satisfies V1≥IV>V2 or V1>IV≥V2; and the second high-frequency electric field has an output power density of 1 W/cm$^2$ or more.

<<Use of Liner>>

As to a support in which a water vapor barrier layer is formed on one surface thereof, when providing a polymer layer, a UV radiation refractive layer, and further a layer (for example, a heat ray reflective layer in which a metal layer made of AL or the like, a dielectric, Ag (or alloy thereof), and a dielectric are laminated in order) on the back surface, a resin support exhibiting a releasing property may be provided in order to prevent the water vapor barrier layer having been already provided from scratches and adhesion of foreign matter.

When a resin material exhibiting releasing ability is laminated on the water vapor barrier layer having been formed on the resin support, generation of scratches caused by contacting rollers and adhesion of foreign matter are prevented, and further, when the number of rollers brought into direct contact with the surface subjected to a plasma treatment is minimized, and the scratches and incorporation of foreign matter into the water vapor barrier layer are reduced as much as possible, a weather-resistant resin support in which a water vapor barrier layer exhibiting excellent a gas barrier property is provided can be prepared in high yield. Therefore, when a water vapor bather layer exhibiting a barrier property on both surfaces of a resin support is provided, lamination of a resin material is preferred.

Further, in cases where a support in which a UV radiation reflective layer is provided on one surface, in the case of providing a water vapor bather layer or a layer other than the water vapor barrier layer on the back layer, similarly to the above-described, a resin material may be laminated on the UV radiation reflective layer.

<<Resin Material Having Exhibiting Releasing Ability>>

As to a method of manufacturing a weather-resistant article of the present invention having gas, before a UV reflective layer is provided on the back surface side (B surface) after a water vapor barrier layer has been formed on one surface side (A surface), it is preferred that a resin material exhibiting releasing ability is laminated on the water vapor barrier layer having been formed on the A surface side to form the weather-resistant article.

A resin material exhibiting releasing ability in the present invention is not specifically limited, but it is composed of at least a film and an adhesive layer containing an adhesive having been formed on one surface of the film; the adhesive is at least one kind selected from an acrylic type adhesive, a silicon based adhesive and a rubber based adhesive; and the adhesive preferably has an adhesive force of at least 1 mN/cm and 2 N/cm or less and more preferably at least 1 mN/cm and 200 mN/cm or less.

When the adhesive has an adhesive force of at least 1 mN/cm, a sufficiently close-attaching force between a resin material and a ceramic layer can be obtained, whereby peeling is not generated during continuous conveyance, and prevented can be influence to the ceramic layer having been already formed, caused by being into contact with a roll or the like during conveyance. Further, in the case of an adhesive force of 2 N/cm or less, when the resin material is peeled off, the ceramic layer is not broken, and no adhesive remains on the ceramic layer without applying excessive force to the ceramic layer.

Adhesive force of an adhesive can be determined by measuring in 20 minutes after pressure-attaching a resin material onto a test plate employing Corning 1737 as the test plate, in accordance with a measuring method based on JIS Z 0237.

Further, the adhesive preferably has a thickness of at least 0.1 µm and 30 µm or less. When the adhesive has a thickness of at least 0.1 µm, a sufficiently close-attaching force between a resin material and a resin support can be obtained, whereby peeling is not generated during continuous conveyance, and prevented can be influence to the ceramic layer having been already formed, caused by being into contact with a roll or the like during conveyance. Further, in the case of thickness of the adhesive being 30 µm or less, when the resin material is peeled off, the ceramic layer is not broken, and no adhesive remains on the ceramic layer without applying excessive force to the ceramic layer.

Further, an adhesive constituting an adhesive layer preferably has a weight average molecular weight of at least 400,000 and 1,400,000 or less. In the case of a weight average molecular weight of at least 400,000, the adhesive force does not become excessive, and in the case of a weight average molecular weight of 1,400,000 or less, the adhesive force can be sufficiently obtained. When the weight average molecular weight is in this range, remaining the adhesive on a ceramic layer can be inhibited, but since heat and energy are to be applied specifically during formation of a ceramic layer via a plasma treatment method, transfer and peeling of an adhesive material tend to be generated, unless being in the appropriate weight average molecular weight range.

Next, each constituent material of the resin material exhibiting releasing ability will be described.

The resin material exhibiting releasing ability in the present invention is mainly composed of a support, an adhesive layer formed on one surface of the support, and a peel-off layer composed of a resin support or the like laminated on the adhesive layer surface, that is, the surface on the side opposite to the support.

(Resin Support Exhibiting Releasing Ability)

The resin support exhibiting releasing ability in the present invention is not specifically limited, but examples thereof include plastic films, for example, a polyolefin based film such as a polyethylene film, a polypropylene film or the like; a polyester film such as polyethylene terephthalate, polybutylene terephthalate or the like; a polyamide based film such as hexamethylene adipamide or the like; a halogen-containing film such as polyvinyl chloride, polyvinylidene chloride, poly fluoroethylene or the like; vinyl acetate and its derivative films, such as polyvinyl acetate, polyvinyl alcohol, an ethylene vinyl acetate copolymer or the like, and the foregoing plastic films are preferable, since they differ from paper sheets, and do not generate microscopic dust. In the present invention, a polyethylene terephthalate film is preferably used in view of heat resistance and easy availability. Further, a resin support containing the foregoing light stabilizer, which exhibits weather resistance is more preferable.

Thickness of the support is not specifically limited, but a thickness of 10-300 µm is used. Preferable is a thickness of 25-150 µm. In the case of a thickness of 10 µm or less, it is difficult to handle the film since it is thin. On the other hand, in the case of a thickness of 300 µm or more, transfer and a closely attaching property to a roll are deteriorated since the film becomes hard.

<Adhesive Layer>

In the present invention, kinds of the adhesive are not specifically limited, and examples thereof include an acrylic adhesive, a rubber based adhesive, a urethane based adhesive, a silicone based adhesive, a UV curable type adhesive and so forth, but at least one kind selected from the group consisting of an acrylic adhesive, a silicone based adhesive, and a rubber based adhesive is preferable.

<Acrylic Adhesive>

A homopolymer of (meth)acrylic acid ester or a copolymer of (meth)acrylic acid ester with other copolymeric monomers is used as the acrylic adhesive. Further, examples of a monomer constituting each of these copolymers or a copolymeric monomer include alkyl ester of (meth)acrylic acid (e.g. methyl ester, ethyl ester, butyl ester, 2-ethylhexyl ester, octyl ester and isononyl ester), hydroxyalkyl ester of (meth)acrylic acid (e.g. hydroxyethyl ester, hydroxybutyl ester, and hydroxyhexyl ester), glycidyl ester (meth)acrylate, (meth) acrylic acid, itaconic acid, maleic anhydride, amide (meth) acrylate, N-hydroxymethylamide (meth)acrylate, alkylaminoalkyl ester (meth)acrylate (e.g. dimethylaminoethyl, methacrylate, and t-butylaminoethyl methacrylate), vinyl acetate, styrene, and acrylonitrile. Acrylic acid alkyl ester whose homopolymer has a glass transition temperature of −50° C. or less is normally used as a monomer as a major component.

As a curable agent for the acrylic adhesive, an isocyanate based curable agent, an epoxy based curable agent or an allysine based curable agent is usable. The aromatic type such as toluylene diisocyanate (TDI) is preferably used as the isocyanate based curable agent in order to obtain stable adhesive force even after storage for a long duration, and to acquire a harder adhesive layer. Further, this adhesive can contain a stabilizer, a UV absorbent, a flame retardant or an antistatic agent as an additive.

To provide a re-peeling property or to keep adhesive force low and stable, it is possible to add the components each containing lower surface energy such as an organic resin containing wax, silicon, or fluorine to such an extent that the components does not migrate to the counterpart support. For example, the organic resin such as wax, higher fatty acid ester or low-molecular phthalic acid ester may be used.

<Rubber Based Adhesive>

As a rubber based adhesive, usable is polyisobutylene rubber, butyl rubber, and a mixture thereof. Further, usable is one in which an adhesion providing agent such as abietic acid rosin ester, a terpene/phenol copolymer, a terpene/indene copolymer or the like is blended in the rubber based adhesive.

Examples of the base polymer for the rubber based adhesive include natural rubber, isoprene based rubber, styrene-butadiene based rubber, recycled rubber, and polyisobutylene based rubber, styrene-isoprene-styrene based rubber, and styrene-butadiene-styrene based rubber, and so forth.

Among these, as a block rubber based adhesive, provided is a composition in which a block copolymer represented by Formula A-B-A and a block copolymer represented by Formula A-B as main components (provided that "A" represents a styrene based polymer block and "B" indicates a butadiene polymer based block, an isoprene polymer based block, or an olefin polymer block obtained via hydrogenation of it, and hereinafter, it is referred to as a styrene based thermoplastic elastomer), and an adhesion providing resin, a softener and so forth are blended.

As the above-described block rubber based adhesive, styrene based polymer block A preferably has an average molecular weight of 4,000 through roughly 120,000, and more preferably has an average molecular weight of 10,000 through roughly 60,000. A glass transition temperature thereof is preferably 15° C. or more. Further, a butadiene polymer based block, an isoprene polymer based block, or an olefin polymer block obtained via hydrogenation of it preferably has an average molecular weight of 30,000 through roughly 400,000, and more preferably has an average molecular weight of 60,000 through roughly 200,000. A glass transition temperature thereof is preferably −15° C. or less.

The weight ratio of component A described above to component B is preferably A/B=5/95 through 50/50, and more preferably A/B=10/90 through 30/70. When the value of A/B exceeds 50/50, rubber elasticity of the polymer is reduced at the normal temperature, whereby adhesiveness is difficult to be produced, and when it is less than 5/95, the styrene domain becomes nondense, and coagulation force is deficient, whereby desired force cannot be obtained, and there appears a problem such that the adhesive layer is broken during peeling.

Further, addition of a polyolefin based resin into the above-described adhesive improves a property of releasing from a peeling paper sheet or a peeling film. Examples of this polyolefin based resin include low-density polyethylene, intermediate-density polyethylene, high-density polyethylene, linear low-density polyethylene, ethylene-a olefin copolymer, propylene-a olefin copolymer, ethylene-ethylacrylate copolymer, ethylene-vinyl acetate copolymer, ethylene-methylmethacrylate copolymer, ethylene-n-butylacrylate copolymer and a mixture thereof.

This polyolefin based resin should have a reduced low molecular weight component. Specifically, the low molecular weight component extracted via distillation at boiling point employing n-pentane is preferably less than 1.0% by weight. When the low molecular weight exceeds 1.0% by weight, this low molecular weight produces an adverse effect to an adhesion property in response to temperature change or aging change, resulting in lowering of adhesive force.

When silicon oil is added into the above-described adhesive, it is possible to further reduce the affinity with the back surface provided with a coating film mainly made up of polyvinyl alcohol. This silicon oil, which is a polymeric compound having a polyalkoxy siloxane chain as a principal chain, has a function of suppressing adhesive force of the adhesive, and discouraging an increasing adhesion phenomenon, in order to improve hydrophobicity of the adhesive layer, and to cause bleeding at the adhesion interface, namely, on the surface of the adhesive layer.

In the present invention, an adhesive layer is prepared via cross-linkage by adding a cross-linking agent into the above-described rubber based adhesive.

The crosslinking agent, for example, for crosslinking of the natural rubber based adhesive sulfur, a vulcanization assistant and a vulcanization accelerating agent (typically represented by dibutylthiocarbide zinc or the like) are employed. Each of polyisocyanates is used as a crosslinking agent capable of crosslinking an adhesive formed mainly from natural rubber and carboxylate copolymer polyisoprene as raw material, at room temperature. Each of polyalkyl phenol resins is used as a crosslinking agent exhibiting heat resistance and a nonpolluting property with respect to the cross-linking agent such as butyl rubber, natural rubber and so forth. The organic peroxide, for example, benzoyl peroxide, dicumyl peroxide or the like is used for cross-linking an adhesive formed from butadiene rubber and natural rubber as raw material to obtain a nonpolluting adhesive. Each of polyfunctional methacryl esters is used as a crosslinking auxiliary agent. Besides, adhesives can be formed by UV radiation cross-linkage or electronic beam cross-linkage.

<Silicon Based Adhesive>

As to an adhesive layer of the present invention, there are an addition-reaction curing type silicon adhesive and a condensation polymerization curing type silicon adhesive, but in the present invention, the addition-reaction curing type silicon adhesive is preferably used.

The following compositions are preferably used as the addition reaction curing type silicon additive composition.

(A) Polydiorganosiloxane having at least two alkenyl groups contained in one molecule
(B) Polyorganosiloxane containing a SiH group
(C) Controlling agent
(D) Platinum catalyst
(E) Conductive particle Herein, component (A) is polydiorganosiloxane having at least two alkenyl groups contained in one molecule. As the polydiorganosiloxane containing such an alkenyl group, those represented by the following Formula (1) can be exemplified.

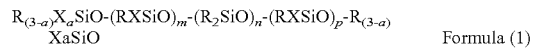

$$R_{(3-a)}X_a SiO\text{-}(RXSiO)_m\text{-}(R_2SiO)_n\text{-}(RXSiO)_p\text{-}R_{(3-a)}X_a SiO \quad \text{Formula (1)}$$

In Formula (1), R represents a monovalent hydrocarbon group having 1-10 carbon atoms, and X represents an organic group containing an alkenyl group. "a" is an integer of 0-3 and is preferably 1, and "m" is 0 or more, but when a=0, m is 2 or more; "m" and "n" each is the number to satisfy $100 \leq m+n \leq 20{,}000$; and "p" is 2 or more.

"R" represents a monovalent hydrocarbon group having 1-10 carbon atoms, and specifically, examples thereof include an alkyl group such as a methyl group, an ethyl group, a propyl group, a butyl group or the like; a cycloalkyl group such as a cyclohexyl group or the like; and an aryl group such as a phenyl group, a tolyl group or the like, but a methyl group and a phenyl group are specifically preferable.

"X" represents an organic group containing an alkenyl group, which preferably has 2-10 carbon atoms, and specifically, examples thereof include a vinyl group, an aryl group, a hexenyl group, an octenyl group, an acryloylpropyl group, an acryloylmethyl group, a methactyloylpropyl group, a cyclohexenylethyl group, a vinyloxypropyl group and so forth, but a vinyl group and a hexenyl group are specifically preferable.

This polydiorganosiloxane may exhibit an oily property and a natural rubber property, and component (A) preferably has a viscosity of 100 mPa·s or more at 25° C., and more preferably has a viscosity of 1000 mPa·s or more. The upper limit is not particularly restricted, but in order to ensure easiness to blend with other components, it should be selected so as to be a polymerization degree of 20,000 or less. In addition, component (A) can be used singly, or in combination with at least two kinds.

Polyorganosiloxane containing an SiH group as a component (B) is a cross-linking agent. It is possible to use an organohydropolysiloxane having at least two hydrogen atoms bonded to silicon atoms in one molecule and preferably having at least three hydrogen atoms in one molecule, and those straight-chained, branched or cyclic are usable.

As component (B), compounds represented by the following Formula (2) can be cited, but the present invention is not limited thereto.

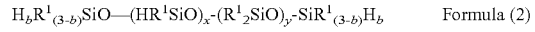

$$H_b R^1_{(3-b)}SiO\text{—}(HR^1SiO)_x\text{-}(R^1_2SiO)_y\text{-}SiR^1_{(3-b)}H_b \quad \text{Formula (2)}$$

In Formula (2), "$R^1$" represents a monovalent hydrocarbon group containing no aliphatic unsaturated bond, which has 1-6 carbon atoms. "b" is an integer of 0-3; each of "x" and "y" is an integer; and represents the number in such a way that this organohydropolysiloxane has a viscosity of 1-5,000 mPa·s at 25° C.

This organohydropolysiloxane preferably has a viscosity of 1-5,000 mPa·s at 25° C., and more preferably has a viscosity of 5-1,000 mPa·s at 25° C. A mixture composed of at least two kinds may be allowed to be used.

Cross-linking via addition reaction is produced between the component (A) and component (B) as an cross-linking agent. The gel fraction of the adhesive layer after curing is determined by a content of the cross-linking component. The amount of component (B) to be used is preferably blended in such a way that the mole ratio of the SiH group in component (B) to the alkenyl group in component (A) is designed to be 0.5-20, and to be preferably 0.8-15. In the case of the mole ratio of less than 0.5, crosslinking density is reduced, and this tends to lower retaining force. On the other hand, in the case of the mole ratio exceeding 20, adhesive force as well as tackiness is reduced, and usable time of a treatment solution tends to be shortened.

In order to improve heat resistance such as heat resistance retaining force and resistance to solvents such as solvent penetration prevention, a content of the cross-linking component in the composition may be increased, but when it is excessively increased, influence by which adhesive force is lowered, and flexibility of the film is reduced. In this regard, a blending weight ratio of component (A)/component (B) is preferably 20/80 through 80/20, and more preferably 45/55 through 70/30. When the blending ratio is less than 20/80, adhesive properties such as adhesive force, tackiness and so forth are degraded. Further, when it is larger than 80/20, sufficient heat resistance can not be obtained.

Component (C) is an addition reaction controlling agent, and is one added in such a way that a treatment solution does not generate thickening and gelation prior to heating and curing, when a silicon adhesive composition is prepared, and coated on a support.

Specific examples of component (C) include:
3-methyl-1-butyne-3-ol
3-methyl-1-pentine-3-ol
3,5-dimethyl-1-hexyne-3-ol
1-ethynylcyclohexanol
3-methyl-3-trimethylcyloxy-1-butyne
3-methyl-3-trimethylcyloxy-1-pentine
3,5-dimethyl-3-trimethylcyloxy-1-hexyne
1-ethynyl-1-trimethylcyloxycyclohexane
bis(2,2-dimethyl-3-butynoxy)dimethylsilane
1,3,5,7-tetramethyl-1,3,5,7-tetravinylcyclotetrasiloxane, and
1,1,3,3-tetramethyl-1,3-divinyldisiloxane.

The blending amount of component (C) is preferably 0-0.5 parts by weight with respect to 100 parts by weight of the total amount of component (A) and component (B), and more preferably 0.05-2.0 parts by weight. When it exceeds 5.0 parts by weight, a curing property tends to be degraded.

Component (D) is a platinum system catalyst, and examples thereof include platinic acid chloride, an alcohol solution of platinic acid chloride, a reaction product between platinic acid chloride and alcohol, a reaction product between platinic acid chloride and an olefin compound, and a reaction product between platinic acid chloride and vinyl group-containing siloxane.

The addition amount of component (D) in terms of a platinum amount is preferably 1-5,000 ppm with respect to the total amount of composition (A) and composition (B), and more preferably 5-2,000 ppm. When the addition amount of component (D) in terms of a platinum amount is less than 1 ppm, a curing property is lowered, cross-linking density and retaining force tend to be lowered, and when it exceeds 5,000 ppm, usable time of the treatment solution tends to be shortened.

Shape of conductive particles of component (E) is not specifically limited, but the conductive particles can be spherical, branch-shaped or needle-shaped. Further, the particle diameter is not specifically restricted, but the maximum particle diameter should not exceed 1.5 times the coating thickness of the adhesive. When it exceeds this value, large protrusions of conductive particles are excessively produced on the surface of the coating adhesive, whereby uplifting from the coated member at this portion as an original location is easy to be produced.

Various additives may be added into an adhesive layer. For example, added may be a cross-linking agent, a catalyst, a plasticizer, an antioxidant, a colorant, an antistatic agent, a filler, an adhesion-providing agent, a surfactant or the like.

In a method of coating an adhesive layer on a support, coating is canned out with a roll coater, a blade coater, a bar coater, an air knife coater, a gravure coater, a reverse coater, a die coater, a lip coater, a spray coater, a comma coater and so forth. The adhesive layer can be formed via smoothing, drying, heating, a process of exposure to electronic beam such as UV radiation or the like.

<Peeling Layer>

As a material used as a peeling layer, a plastic film generating dust may be preferable. The plastic film used as a peeling layer of the present invention is not specifically limited, but usable examples thereof include a polyolefin based film such as a polyethylene film and a polypropylene film or the like; a polyester film such as polyethylene terephthalate, polybutylene terephthalate or the like; a polyamide based film such as hexamethylene adipamide or the like; a halogen based film such as polyvinyl chloride, poly vinylidene chloride, polyfluoro ethylene or the like; vinyl acetate such as polyvinyl acetate, polyvinyl alcohol, an ethylene vinyl acetate copolymer or the like; and a derivative thereof. The polyester film is preferable, and is a polyethylene terephthalate film, for example, because of generation of elasticity. The plastic film used for a peeling layer may also be one in which a peeling agent is coated. Specific examples of coating solutions to conduct a releasing treatment include 636, 919, 920, 921 and 924 as the non-solvent type coating solution among DEHESIVE series of Asahi Kasei Wacker Silicon Co.; 929, 430, 440, 39005 and 39006 as the emulsion type coating solution; 940, 942, 952, 953 and 811 as the solvent type coating solution; and TPR6500, TPR6501, UV9300, UV9315, XS56-A2775, XS56-A2982, TPR6600, TPR6605, TPR6604, TPR6705, TPR6722, TPR6721, TPR6702, XS56-B3884, XS56-A8012, XS56-B2654, TPR6700, TPR6701, TPR6707, TPR6710, TPR6712, XS56-A3969, XS56-A3075, and YSR3022 as silicon for peeling paper produced by GE Toshiba Silicon Co., Ltd. A protective film exhibiting releasing ability can be easily removed after forming a heat-ray shielding constituent layer.

<<Optical Member>>

The weather-resistant resin base parts produced in the present invention can be applied to a wide range of fields. For example, those are used for overlay films for the purpose of surface protection, gloss enhancement and discoloration and deterioration prevention for a marking film used by attaching onto the surfaces of railway vehicles, cars, automatic vending machines and so forth, or for films used mainly for the purpose of enhancing weather resistance as a support for a surface protective film of an exterior signboard; an antireflection film of a liquid crystal display; a backseat for a solar battery; a film for an electronic paper sheet; an electromagnetic wave shielding film for a plasma display; a film for organic electroluminescence; a film attached onto a window such as a heat ray reflecting film which is attached onto windows of facilities exposed to sunlight for a long duration, such as outdoor windows of building and car windows, so as to provide a heat ray reflecting effect; a support of a reflective board; a support of a light collecting board; a film for a vinyl house for agriculture; and so forth. Specifically, those are suitable for optical members used under the environment where the optical member is exposed to UV radiation, whose function is largely deteriorated via variation of optical performance of the support, for example, transmittance, reflectance, haze, color tone and mechanical strength. Specific examples thereof include optical members such as an antireflection sheet of a liquid crystal display; a backseat for a solar battery; a film for an electronic paper sheet; an electromagnetic wave shielding film for a plasma display, a film for organic electroluminescence; supports of films to be attached onto windows such as a heat ray reflecting film which is attached onto windows of facilities exposed to sunlight for a long duration, for example, outdoor windows of buildings and car windows, so as to provide a heat ray reflecting effect; a support of a reflective board; a film for a vinyl house for agriculture; and so forth. Further, those are further preferred for members used in an outdoor location. Specific examples thereof include a backseat for a solar battery; a support of a film to be attached onto windows such as a heat ray reflecting film which is attached onto windows of facilities exposed to sunlight for a long duration, for example, outdoor windows of buildings and car windows, so as to provide a heat ray reflecting effect; a reflective board; a light collecting board, a film for a vinyl house for agriculture; and so forth.

<<Weather-Resistant Film>>

A resin support easily generating deterioration caused specifically by UV radiation is useful in the present invention. Specifically, it is suitable for an optical member since the optical member exhibits high visible light transmittance, and is clear.

When it is used as a weather-resistant film, an adhesive layer is preferably coated since it is attached onto a substrate made of glass or the like.

The adhesive layer may be provided on any of the side where no UV radiation reflective layer is present and the other side where a UV radiation reflective layer is present, but the other side where the UV radiation reflective layer is present faces the side exposed to UV radiation to use it. That is, when a support is exposed to UV radiation, designed may be a structure in which UV radiation is shielded by a UV radiation reflective layer and a polymer layer containing a light stabilizer. Further, when UV radiation is incident from both surfaces of a support, UV radiation reflective layers may be provided on both surfaces of a support. Further, as to attaching onto a substrate made of glass or the like, a UV radiation reflective layer is provided only on one surface of a resin support, the side where no UV radiation reflective layer is present is preferably attached onto a substrate made of glass or the like. As the foregoing adhesive, usable is an adhesive made of a photo-curable or thermosetting resin.

As to the foregoing adhesive, one exhibiting durability to UV radiation is preferable, and an acrylic adhesive or a silicon based adhesive is preferable. Further, an acrylic adhesive is preferable in view of an adhesion property and coat. As to the acrylic adhesive, a solvent based one is preferable among those such as a solvent based one and an emulsion based one specifically in view of easy control of peeling strength. When using a solution polymerization polymer as an acrylic solvent based adhesive, a commonly known monomer is usable as the monomer. For example, as a main monomer for a moiety, acrylic acid esters such as ethyl acrylate, butyl acrylate, 2-ethyl hexyl acrylate, oquryl acrylate and so forth can be preferably exemplified. As a comonomer to improve coagulation force, vinyl acetate, acrylonitrile, styrene, methyl methacrylate and so forth can be preferably exemplified. Further, as a functional group-containing monomer to accelerate cross-linking to provide stable adhesive force, and to maintain a certain amount of adhesive force in the presence of water, a methacrylic acid, an acrylic acid, an itaconic acid, hydroxyethyl methacrylate, glycidyl methacrylate and so forth can be preferably exemplified.

The adhesive can be prepared by a commonly known method. For example, a predetermined starting material is charged in a reaction chamber in the presence of an organic solvent such as ethyl acetate or the like, and toluene, and is polymerized under heat employing peroxide based one such as benzoyl peroxide or the like, or azobis based one such as azobisisobutyronitrile or the like. In order to increase molecular weight, for example, there is a method of charging monomers collectively in the initial stage of reaction, or as the organic solvent type, ethyl acetate other than toluene having a large chain transfer coefficient, which suppresses polymer growth may be used. Weight average molecular weight (Mw) of a polymer is preferably 400,000 or more, and more preferably 500,000 or more. When the molecular weight is less than 400,000, a polymer exhibiting a sufficient coagulation force can not be obtained, even though cross-linking is done with an isocyanate hardener, and dropping instantly occurs in evaluation of retention force under application of a load, or when peeling after aging, and after attaching it onto a glass plate, the adhesive tends to remain on the glass plate.

As a hardener for the adhesive, specifically in the case of an acrylic solvent based one, a conventional hardener such as an isocyanate based hardener or epoxy based hardener is used, but an isocyanate based hardener is preferable since flowability and cross-linking of an adhesive are desired via aging to obtain a uniform film.

In the foregoing adhesive layer, for example, a stabilizer, a UV absorbent, a flame retardant, an antistatic agent or the like may be contained as an additive. The adhesive layer preferably has a thickness of 5-50 µm.

As a method of coating the adhesive agent, a commonly known method is optionally usable, and examples thereof include a die coater method, a gravure coater method, a blade coater method, a spray coater method, an air knife coat method, a dip coat method and so forth. Further, a physical surface treatment such as a flame treatment, a corona discharge treatment, a plasma discharge treatment or the like, and a chemical surface treatment such as organic or inorganic resin coating producing easy adhesion or the like are preferably conducted before laminating an adhesive, for the purpose of improving adhesiveness and a coatability, if desired.

It is preferred in the present invention that a hard coat film is formed on a UV radiation layer for resistance to scratches. The foregoing polymer layer is usable as a hard coat layer. Since a hard coat layer serves as a buffer film via formation of the hard coat layer, resistance to impact can be improved, resulting in prevention of damages such as cracks pr the like.

Further, a fluorine-containing film is preferably formed on a UV reflective layer and the foregoing hard coat layer for prevention of scratches. The fluorine-containing film exhibits low coefficient of friction because of low surface energy. Therefore, scratches against friction are difficult to be produced. Further, the fluorine-containing film serves as a contamination-resistant film exhibiting resistance to adhesion against dust.

EXAMPLE

Next, the present invention will be described in detail referring to examples, but the present invention is not limited thereto.

EXAMPLE

Example 1

[Preparation of Sample 1]
<Preparation of Resin Support 1>

Coating solution 1 containing a UV absorbent having the following composition as a light stabilizer was prepared, and coated on PET (polyethylene terephthalate) film HS (having a thickness of 50 μm) produced by Teijin Dupont Limited as a resin support employing a microgravure coater so as to give a layer thickness of 5 μm after curing, followed by heating with hot air at 80° C./110° C./125° C. (in each zone for 30 seconds) to form polymer layer 1.

<Coating Solution 1>

Sixty five % by weight of methyl methacrylate and 35% by weight of 2-hydroxyethyl methacrylate were copolymerized to obtain a hydroxyl group-introducing methacrylic acid ester resin having an average molecular weight of 50000. Five % by weight of 2-(2H-benzotriazole-2-yl)-4,6-di-t-pentyl phenol (TINUVIN 328, produced by Ciba Japan) as a benzotriazole based UV absorbent (as a UV absorbent) and 5% by weight of decanedioic acid bis[2,2,6,6-tetramethyl-1 (octyloxy)-4-piperidinyl] ester (TINUVIN 123, produced by Ciba Japan) were blended, and diluted with methylethyl ketone to adjust viscosity to obtain main agent (a) adjusted so as to give 20% by weight in solid content. On the other hand, as a poly isocyanate compound for a cross-linking agent (hardener), prepared was hardener (b) in which adduct type hexamethylenediisocyanate was adjusted with methylethyl ketone so as to give 75% by weight in solid content. Fifteen % by weight of the above-described hardener (b) were added into the above-described main agent (a) to prepare coating solution 1.

<Formation of UV Radiation Reflective Layer>

Figure 6:
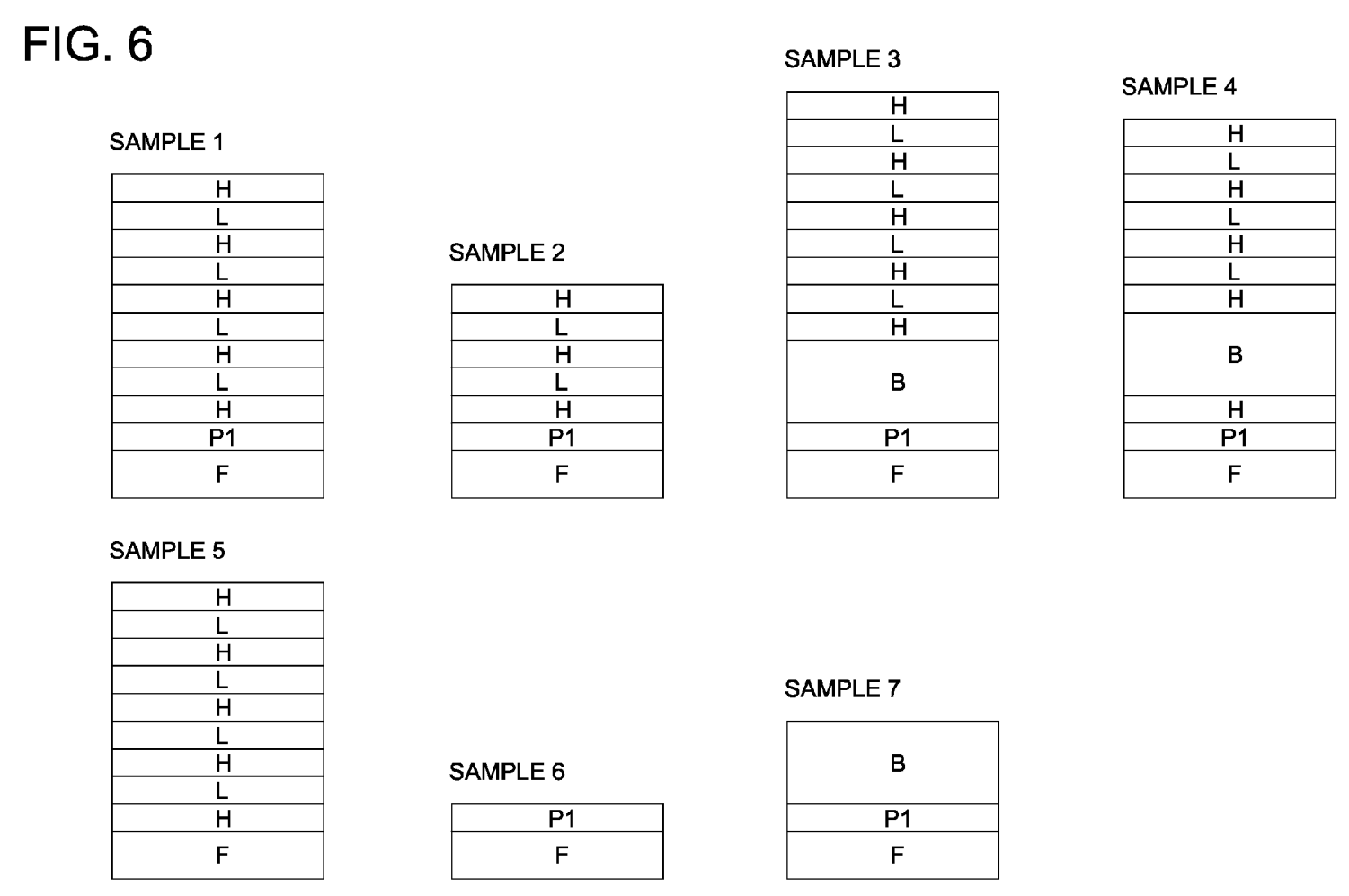

A high refractive index layer (thickness: 35 nm, refractive index: 2.1) and a low refractive index layer (thickness: 52 nm, refractive index: 1.46) are alternatingly laminated to provide 9 layers under the following conditions, whereby a UV radiation reflective layer composed of 9 layers is formed to prepare sample 1 (FIG. 6). UV radiation reflectance at a wavelength of 350 nm, measured via incident light from the UV radiation reflective layer in this sample was 82%.

<Preparation of High Refractive Index Layer>
<Mixed Gas Composition for High Refractive Index Layer Formation>

| | |
|---|---|
| Discharge gas: Nitrogen | 97.9% by volume |
| Thin film forming gas: Tetraisopropoxy titanium | 0.1% by volume |
| Addition gas: Hydrogen | 2.0% by volume |

<Film Formation Condition of High Refractive Index Layer>
The First Electrode Side
 Power supply type: Heiden laboratory 100 kHz (continuous mode) PHF-6k
 Frequency: 100 kHz
 Output power density: 10 W/cm$^2$ (a voltage Vp of 7 kV at this time)
 Electrode temperature: 120° C.
The Second Electrode Side
 Power supply type: Pearl Kogyo Co., Ltd. 13.56 MHz CF-5000-13M
 Frequency: 13.56 MHz
 Output power density: 5 W/cm$^2$ (a voltage Vp of 1 kV at this time)
 Electrode temperature: 90° C.

(Preparation of Low Refractive Index Layer)
<Mixed Gas Composition for Low Refractive Index Layer>

| | |
|---|---|
| Discharge gas: Nitrogen | 98.9% by volume |
| Thin film forming gas: tetraethoxy silane | 0.1% by volume |
| Addition gas: Oxygen | 1.0% by volume |

<Film Formation Condition of Low Refractive Index Layer>
The First Electrode Side
 Power supply type: Heiden laboratory 100 kHz (continuous mode) PHF-6k
 Frequency: 100 kHz
 Output power density: 10 W/cm$^2$ (a voltage Vp of 7 kV at this time)
 Electrode temperature: 120° C.
The Second Electrode Side
 Power supply type: Pearl Kogyo Co., Ltd. 13.56 MHz CF-5000-13M
 Frequency: 13.56 MHz
 Output power density: 10 W/cm$^2$ (a voltage Vp of 2 kV at this time)
 Electrode temperature: 90° C.

Example 2

[Preparation of Sample 2]
Sample 2 was prepared similarly to preparation of sample 1, except that the UV radiation reflective layer is composed of 5 layers. UV radiation reflectance of this sample was 72%.

Example 3

[Preparation of Sample 3]
Sample 3 was prepared similarly to preparation of sample 1, except that under the following conditions, formed was a water vapor barrier layer in which SiO$_2$ film 1 having a thickness of 50 nm and a carbon content of 7.8 at %, SiO$_2$ film 2 having a thickness of 50 nm and a carbon content of 0.1 at % or less, and SiO$_2$ film 3 having a thickness of 100 nm and a carbon content of 7.8 at % are laminated in order between a polymer layer and a UV radiation reflective layer, and laminated also on the polymer layer. UV radiation reflectance at this time was 82%.

<Formation of Water Vapor Barrier Layer>
(Preparation of SiO$_2$ Film 1)
<SiO$_2$ Film 1 Mixed Gas Composition>

| | |
|---|---|
| Discharge gas: Nitrogen gas | 94.85% by volume |
| Thin film forming gas: Hexamethyldisiloxane | 0.15% by volume |
| Addition gas: Oxygen gas | 5.0% by volume |

<Film Formation Condition of SiO$_2$ Film 122
The First Electrode Side
 Power supply type: Heiden laboratory 100 kHz (continuous mode) PHF-6k
 Frequency: 100 kHz
 Output power density: 10 W/cm$^2$ (a voltage Vp of 7 kV at this time)
 Electrode temperature: 120° C.
The Second Electrode Side
 Power supply type: Pearl Kogyo Co., Ltd. 13.56 MHz CF-5000-13M Frequency: 13.56 MHz
Output power density: 5 W/cm² (a voltage Vp of 1 kV at this time)
Electrode temperature: 90° C.
(Preparation of SiO₂ Film 2)
<SiO₂ Film 2 Mixed Gas Composition>

| Discharge gas: Nitrogen gas | 94.99% by volume |
| Thin film forming gas: Tetraethoxy silane | 0.01% by volume |
| Addition gas: Oxygen gas | 5.0% by volume |

<Film Formation Condition of SiO₂ Film 222
The First Electrode Side
Power supply type: Heiden laboratory 100 kHz (continuous mode) PHF-6k
Frequency: 100 kHz
Output power density: 10 W/cm² (a voltage Vp of 7 kV at this time)
Electrode temperature: 120° C.
The Second Electrode Side
Power supply type: Pearl Kogyo Co., Ltd. 13.56 MHz CF-5000-13M
Frequency: 13.56 MHz
Output power density: 10 W/cm² (a voltage Vp of 2 kV at this time)
Electrode temperature: 90° C.
(Preparation of SiO₂ Film 3)
<SiO₂ Film 3 Mixed Gas Composition>

| Discharge gas: Nitrogen gas | 94.5% by volume |
| Thin film forming gas: Hexamethyldisiloxane | 0.5% by volume |
| Addition gas: Oxygen gas | 5.0% by volume |

<Film Formation Condition of SiO₂ film 3>
The First Electrode Side
Power supply type: Heiden laboratory 100 kHz (continuous mode) PHF-6k
Frequency: 100 kHz
Output power density: 10 W/cm² (a voltage Vp of 7 kV at this time)
Electrode temperature: 120° C.
The Second Electrode Side
Power supply type: Pearl Kogyo Co., Ltd. 13.56 MHz CF-5000-13M
Frequency: 13.56 MHz
Output power density: 5 W/cm² (a voltage Vp of 1 kV at this time)
Electrode temperature: 90° C.

Example 4

[Preparation of Sample 4]
Sample 4 was prepared similarly to preparation of sample 1, except that a layer closest to the support among low refractive index layers in the UV radiation reflective layer was replaced by a water vapor barrier layer formed by the above-described method. UV radiation reflectance at this time was 70%.

Comparative Example 1

Sample 5 was prepared similarly to preparation of sample 1, except that a polymer layer containing a light stabilizer was removed from sample 1.

Comparative Example 2

Sample 6 was prepared similarly to preparation of sample 1, except that no UV radiation reflective layer is provided in sample 1.

Comparative Example 3

Sample 7 was prepared similarly to preparation of sample 3, except that no UV radiation reflective layer is provided in sample 3.

As to the resulting samples 1-4 (Examples) and samples 5-7 (Comparative examples) described above, cross-sectional structures thereof are shown in FIG. 6. Symbol H represents a high refractive index layer; symbol L represents a low refractive index layer; symbol P1 represents polymer layer 1 (containing a light stabilizer); symbol B represents a water vapor bather layer (as a low refractive index layer); and symbol F represents a resin support (PET).
[Evaluation of Sample]
The resulting sample whose support side was attached onto glass was evaluated as described below.
(Water Vapor Permeability)
The water vapor permeability was measured with a water vapor permeability measuring device PERMATRAN-W3/33MG MODULE in accordance with a method specified by JIS K 7129 B (40° C. and 90% RH).
[Durability Evaluation 1: Weather Resistance]
The forced UV radiation exposure test was conducted under the following conditions employing an accelerated UV testing apparatus EYE SUPPER UV TESTER-SUV-W131 manufactured by IWASAKI Electric Co., Ltd. to conduct each measurement for samples each having been exposed to UV radiation.
[UV Radiation Exposure Condition]
illuminance: 100 mW/cm²
Temperature: 60° C.
Relative humidity: 50% RH
Exposure time: 100 hours
Surface exposed to UV radiation: The UV radiation reflective layer side is facing a light source.
[Durability Evaluation 2: Humidity Resistance]
The forced high humidity test was conducted under the following conditions employing a highly accelerated stress test system HAST CHAMBER EHS-211M manufactured by ESPEC Corporation to conduct each measurement for samples after the test.
[High Humidity Exposure Condition]
Temperature: 120° C.
Relative humidity: 100% RH (2.026510⁻¹ MPa)
Exposure time: 48 hours
(Haze)
Haze (%) in the film thickness direction after the test was measured employing a haze meter T-2600DA manufactured by Tokyo Denshoku Co., Ltd.
(Yellowish Change)
"L", "a" and "b" of each of samples before and after the above-described weather resistance test were measured by a transmission technique employing a spectroscopic system color difference meter SE-2000 type (manufactured by Nippon Denshoku Industries Co., Ltd.) in accordance with JIS-K-7105, and yellowish change was evaluated with "b" to make evaluations by the following criteria.
A: The increasing amount of "b" after the weather resistance test is less than 2.0.
B: The increasing amount of "b" after the weather resistance test is at least 2.0 and less than 6.0.

C: The increasing amount of "b" after the weather resistance test is at least 6.0.
(Mechanical Strength)

The mechanical strength of each of samples before and after the above-described weather resistance test was measured employing a tensile stress measuring device (010, manufactured by Zwick GmbH, Ulm, Germany) in accordance with ISO 527-1-2, and evaluated by the following criteria.

A: The mechanical strength after the weather resistance test, based on before the weather resistance test is at least 80%.

B: The mechanical strength after the weather resistance test, based on before the weather resistance test is at least 60% and less than 80%.

C: The mechanical strength after the weather resistance test, based on before the weather resistance test is less than 60%

The evaluation results are shown in Table 1.
(Optical Performance 1: Visible Light Transmittance)

The transmission spectrum was measured by a spectrophotometer U-4000 type, manufactured by Hitachi Ltd. in accordance with JIS 85759 to calculate visible light transmittance (%).
(Optical Performance 2: UV Radiation Reflectance)

The reflection spectrum was measured by a spectrophotometer U-4000 type, manufactured by Hitachi Ltd. in accordance with ISO 9050 to calculate UV radiation reflectance (%).

36B Dielectric
40 Electric field application device
41 The first power supply
42 The second power supply
50 Gas supply device
51 Gas generator
52 Gas feeding port
53 Exhaust gas port
60 Electrode temperature adjustment device
70 Acid-introducing device
G Thin film forming gas
G° Gas in a plasma state
G' Exhaust gas

The invention claimed is:

1. A weather-resistant film comprising:
a support and provided thereon;
a polymer layer comprising a light stabilizer;
a UV radiation reflective layer comprising plural materials each having a different refractive index, the UV radiation reflective layer provided on the polymer layer; and
a water vapor barrier layer having a refractive index of 1.4 - 1.8,
wherein the water vapor barrier layer comprises at least one silicon oxide film having carbon present in an amount of less than 0.1 at % and at least one silicon oxide film having carbon present in an amount of 1 -40 at %.

2. The weather-resistant film of claim 1,
wherein the water vapor barrier layer is provided between the polymer layer and the UV radiation reflective layer.

TABLE 1

| | Initial value | | | Durability evaluation 1 (Weather resistance) | | | | Durability evaluation 2 (Humidity resistance) | | | |
|---|---|---|---|---|---|---|---|---|---|---|---|
| | Water vapor permeability (g/m · day · atm) | UV radiation reflectance (%) | Haze (%) | Visible light transmittance (%) | Haze (%) | Visible light transmittance (%) | Mechanical strength | Yellowish change | Haze (%) | Visible light transmittance (%) | Mechanical strength | Yellowish change |
| Example 1 | 1 | 83 | 0.7 | 82 | 0.8 | 78 | A | A | 1.5 | 79 | A | A |
| Example 2 | 1 | 72 | 0.7 | 77 | 0.8 | 73 | A | B | 1.5 | 75 | A | A |
| Example 3 | 0.01< | 83 | 0.7 | 81 | 0.7 | 81 | A | A | 0.7 | 81 | A | A |
| Example 4 | 0.01< | 70 | 0.7 | 80 | 0.7 | 80 | A | B | 0.7 | 80 | A | A |
| Comp. 1 | 1 | 82 | 0.7 | 81 | 2.2 | 72 | B | C | 2 | 79 | A | A |
| Comp. 2 | 1 | 20< | 0.7 | 85 | 2.5 | 68 | B | C | 2.1 | 81 | A | A |
| Comp. 3 | 0.01< | 20< | 0.7 | 82 | 0.7 | 75 | B | C | 0.7 | 79 | A | A |

Comp.: Comparative example

It is to be understood that each of samples of the present invention is a support exhibiting excellent weather resistance, and the support is possible to sufficiently shield UV radiation and exhibits sufficient weather resistance even though receiving influences by heat, light or moisture.
Explanation Of Numerals
10 Plasma discharge treatment apparatus
11 The first electrode
12 The second electrode
21 The first power supply
23, 43 The first filter
24, 44 The second filter
30 Plasma discharge treatment apparatus
32 Discharge space
35 Roll rotating electrode
35a Roll electrode
35A Metallic base martial
35B Dielectric
36a Fixed electrode
36A Metallic base martial 3. The weather-resistant film of claim 1,
wherein the UV radiation reflective layer comprises:
a low refractive index layer having a refractive index of 1.4 -1.8 and a layer thickness of 5 - 1000 nm;
a high refractive index layer having a refractive index of 1.8 -2.4 and a layer thickness of 5 -400 nm;
the low refractive index layer and the high refractive index layer being alternatingly laminated to provide at least three layers;
the low refractive index layer containing an oxide or a nitrogen oxide containing Si or Al; and
the high refractive index layer containing an oxide, a nitrogen oxide or a nitride containing Zn, Ti, Sn, In, Nb, Si, Ta or Al.

4. The weather-resistant film of claim 1, wherein the support comprises a transparent support.

5. The weather-resistant film of claim 4, wherein the transparent support is made of a resin.

6. The weather-resistant film of claim 1, wherein the light stabilizer comprises a UV absorbent.

7. The weather-resistant film of claim 1, comprising the UV radiation reflective layer formed by supplying a gas containing a thin film forming gas and a discharge gas into a discharge space under the atmospheric pressure or a pressure close to the atmospheric pressure to excite the gas via application of a high-frequency electric field to the discharge space, and exposing the support to the excited gas.

8. The weather-resistant film of claim 7,
wherein the discharge gas is nitrogen gas;
the high-frequency electric field applied to the discharge space is a high-frequency electric field obtained by superimposing a first high frequency-electric field and a second high-frequency electric field, where frequency $\omega 2$ of the second high-frequency electric field is higher than frequency $\omega 1$ of the first high-frequency electric field;
a relationship among first high-frequency electric field intensity V1, second high-frequency electric field intensity V2, and discharge starting electric field intensity IV satisfies V1≥IV>V2 or V1>IV≥V2; and
the second high-frequency electric field has an output power density of 1 W/cm² or more.

9. The weather-resistant film of claim 1,
wherein the polymer layer comprises a photo-curable or thermosetting resin as a main component.

10. The weather-resistant film of claim 1,
wherein the support is a support made of a resin comprising polyethylene terephthalate, polybutylene terephthalate or polyethylene naphthalate.

11. The weather-resistant film of claim 1, comprising the support made of a resin and provided on at least one surface of the support, the polymer layer comprising the light stabilizer, the UV radiation reflective layer comprising the plural layers each having a different refractive index and the water vapor barrier layer, the UV radiation reflective layer and the water vapor barrier layer provided on the polymer layer.

12. The weather-resistant film of claim 11,
wherein the water vapor barrier layer comprises a metal oxide layer containing oxide, nitrogen oxide or nitride containing Si or Al.

13. The weather-resistant film of claim 11, comprising the water vapor barrier layer formed via a thin film forming method to prepare a thin film on the support made of a resin by supplying a gas containing a thin film forming gas and a discharge gas into a discharge space under the atmospheric pressure or a pressure close to the atmospheric pressure to excite the gas via application of a high-frequency electric field to the discharge space, and exposing the support made of a resin to the excited gas.

14. The weather-resistant film of claim 13,
wherein the discharge gas is nitrogen gas;
the high-frequency electric field applied to the discharge space is a high-frequency electric field obtained by superimposing a first high frequency-electric field and a second high-frequency electric field, where frequency $\omega 2$ of the second high-frequency electric field is higher than frequency $\omega 1$ of the first high-frequency electric field;
a relationship among first high-frequency electric field intensity V1, second high-frequency electric field intensity V2, and discharge starting electric field intensity IV satisfies V1 IV>V2 or V1>IV V2; and
the second high-frequency electric field has an output power density of 1 W/cm² or more.

15. The weather-resistant film of claim 1, exhibiting a visible light transmittance of 75% or more.

16. The weather-resistant film of claim 1, exhibiting a haze of 1.5% or less.

17. The weather-resistant film of claim 11, comprising the UV radiation reflective layer composed of low refractive index layers, at least one of the low refractive index layers being the water vapor barrier layer.

18. The weather-resistant film of claim 1,
wherein the UV radiation reflective layer has a layer thickness of $\lambda/2n$ where $\lambda$ represents a UV radiation wavelength of 290-400 nm, and n represents a refractive index of one of the plural layers.

19. An optical member comprising the weather-resistant film of claim 1.

* * * * *